(12) United States Patent
Ma et al.

(10) Patent No.: US 10,510,987 B2
(45) Date of Patent: Dec. 17, 2019

(54) DISPLAY PANEL AND MANUFACTURING METHOD THEREFOR, AND DISPLAY DEVICE

(71) Applicants: BOE Technology Group Co., Ltd., Beijing (CN); Chengdu BOE Optoelectronics Technology Co., Ltd., Chengdu (CN)

(72) Inventors: Guoqiang Ma, Beijing (CN); Yang Wang, Beijing (CN); Kuo Sun, Beijing (CN)

(73) Assignees: BOE Technology Group Co., Ltd., Beijing (CN); Chengdu BOE Optoelectronics Technology Co., Ltd., Sichuan Province (CN)

( * ) Notice: Subject to any disclaimer, the term of this patent is extended or adjusted under 35 U.S.C. 154(b) by 0 days.

(21) Appl. No.: 16/033,640

(22) Filed: Jul. 12, 2018

(65) Prior Publication Data
US 2019/0131569 A1 May 2, 2019

(30) Foreign Application Priority Data
Oct. 31, 2017 (CN) .......................... 2017 1 1041657

(51) Int. Cl.
*H01L 51/52* (2006.01)
*H01L 51/56* (2006.01)

(52) U.S. Cl.
CPC .......... *H01L 51/5253* (2013.01); *H01L 51/56* (2013.01); *H01L 2251/566* (2013.01)

(58) Field of Classification Search
CPC .................................................... H01L 51/0097
See application file for complete search history.

(56) References Cited

U.S. PATENT DOCUMENTS

2003/0205845 A1* 11/2003 Pichler ................ H01L 51/5253
264/272.11

* cited by examiner

*Primary Examiner* — William A Harriston
(74) *Attorney, Agent, or Firm* — Fay Sharpe LLP

(57) ABSTRACT

A display panel and manufacturing method thereof, and a display device are provided. The method includes: forming an encapsulation structure layer on a display motherboard to obtain a panel motherboard, the encapsulation structure layer comprising at least one encapsulation film layer, and the at least one encapsulation film layer overlying a surface of the display motherboard; forming a cutting groove on the encapsulation structure layer along a cutting line of the panel motherboard; filling the cutting groove with an isolation material, the isolation material having greater flexibility than the encapsulation film layer in contact with the isolation material; and cutting the panel motherboard from the isolation material along the cutting line to obtain the display panel. The display panel helps improve the encapsulation effect of the encapsulation structure.

20 Claims, 24 Drawing Sheets

DISPLAY PANEL AND MANUFACTURING METHOD THEREFOR, AND DISPLAY DEVICE

This application claims priority to Chinese Patent Application No. 201711041657.2, filed with the State Intellectual Property Office on Oct. 31, 2017 and titled "DISPLAY PANEL AND MANUFACTURING METHOD THEREFOR, AND DISPLAY DEVICE", the entire contents of which are incorporated herein by reference.

TECHNICAL FIELD

The present disclosure relates to a display panel and manufacturing method thereof, and a display device.

BACKGROUND

Organic light-emitting diode (OLED) display panels have advantages such as high brightness, high contrast, full viewing angle, and flexible displaying, and are widely used in the display industry. An OLED display panel includes a display substrate and an encapsulation structure provided on the display substrate. The encapsulation structure is used to encapsulate an OLED device on the display substrate, so as to protect the OLED device from erosion by the constituents of air.

The OLED display panel is a display panel formed by cutting an OLED panel motherboard. The OLED panel motherboard includes a display motherboard and an encapsulation structure layer provided on the display motherboard. The display motherboard has a plurality of display areas, and each of the display areas is provided with an OLED device. The encapsulation structure layer includes a plurality of encapsulation structures in one-to-one correspondence with the plurality of display areas. Each of the encapsulation structures is used to encapsulate the OLED device in the corresponding display area, and each of the encapsulation structures includes an inorganic layer, an organic layer, and an inorganic layer which are superimposed.

The above encapsulation structure has a poor encapsulation effect.

SUMMARY

The present disclosure provides a display panel and manufacturing method thereof, and a display device.

In a first aspect, there is provided a method for manufacturing a display panel, comprising steps of: forming an encapsulation structure layer on a display motherboard to obtain a panel motherboard, the encapsulation structure layer comprising at least one encapsulation film layer, and the at least one encapsulation film layer overlying a surface of the display motherboard; forming a cutting groove on the encapsulation structure layer along a cutting line of the panel motherboard; filling the cutting groove with an isolation material, the isolation material having greater flexibility than the encapsulation film layer in contact with the isolation material; and cutting the panel motherboard from the isolation material along the cutting line to obtain the display panel.

Optionally, after forming the encapsulation structure layer on the display motherboard to obtain the panel motherboard, the method further comprises: forming a protective seam on the encapsulation structure layer, the protective seam being located between a display area and the cutting line of the panel motherboard, and the depth direction of the protective seam being perpendicular to a surface of the encapsulation structure layer.

Optionally, after forming the protective seam on the encapsulation structure layer, the method further comprises: filling the protective seam with the isolation material.

Optionally, said step of forming the cutting groove on the encapsulation structure layer along the cutting line of the panel motherboard comprises: forming the cutting groove on the encapsulation structure layer along the cutting line of the panel motherboard using an etching process; and said step of forming the protective seam on the encapsulation structure layer comprises: forming the protective seam on the encapsulation structure layer using an etching process.

Optionally, said step of filling the cutting groove with the isolation material comprises: forming an isolation layer on the panel motherboard using the isolation material to fill the cutting groove with the isolation material.

Optionally, the isolation material is a polyimide material or an acrylic material.

Optionally, the panel motherboard has a non-display area and a display area, when the isolation material is a polyimide material, the isolation layer comprises an isolation area that overlies the non-display area; and when the isolation material is an acrylic material, the isolation layer comprises an isolation area that overlies the non-display area, or, the isolation layer overlies the surface of the panel motherboard.

Optionally, cutting the panel motherboard from the isolation material along the cutting line comprises: cutting the panel motherboard from the isolation material along the cutting line using a laser cutting process.

Optionally, the at least one encapsulation film layer comprises an inorganic layer, an organic layer, and an inorganic layer which are sequentially superimposed, and said step of forming the encapsulation structure layer on the display motherboard comprises: forming an inorganic layer on the display motherboard using a chemical vapor deposition process: forming an organic layer on the display motherboard on which the inorganic layer is formed using an ink-jet printing process; and forming an inorganic layer on the display motherboard on which the organic layer is formed using a chemical vapor deposition process, thereby obtaining the encapsulation structure layer.

In a second aspect, there is provided a display panel, comprising an encapsulation structure, wherein the encapsulation structure comprises at least one encapsulation film layer, the outside of the at least one encapsulation film layer is provided with an isolation material, and the isolation material has greater flexibility than the encapsulation film layer in contact with the isolation material.

Optionally, the periphery of the encapsulation structure is provided with a protective seam, the depth direction of the protective seam is perpendicular to the surface of the encapsulation structure, and the orthographic projection of the periphery of the encapsulation structure on the display panel is located in a non-display area of the display panel.

Optionally, the protective seam is filled with the isolation material.

Optionally, the display panel further comprises a display substrate, the display substrate is provided with a display device, and the encapsulation structure is used to encapsulate the display device.

Optionally, the display device is an organic light-emitting diode device or a quantum dot light-emitting diode device.

Optionally, the at least one encapsulation film layer comprises an inorganic layer, an organic layer, and an inorganic layer which are sequentially superimposed.

In a third aspect, there is provided a display device, comprising a display panel, wherein the display panel comprises an encapsulation structure, the encapsulation structure comprises at least one encapsulation film layer, the outside of the at least one encapsulation film layer is provided with an isolation material, and the isolation material has greater flexibility than the encapsulation film layer in contact with the isolation material.

Optionally, the periphery of the encapsulation structure is provided with a protective seam, the depth direction of the protective seam is perpendicular to the surface of the encapsulation structure, and the orthographic projection of the periphery of the encapsulation structure on the display panel is located in a non-display area of the display panel.

Optionally, the protective seam is filled with the isolation material.

Optionally, the display panel further comprises a display substrate, the display substrate is provided with a display device, and the encapsulation structure is used to encapsulate the display device.

Optionally, the display device is an organic light-emitting diode device or a quantum dot light-emitting diode device.

DETAILED DESCRIPTION

Figure 1:
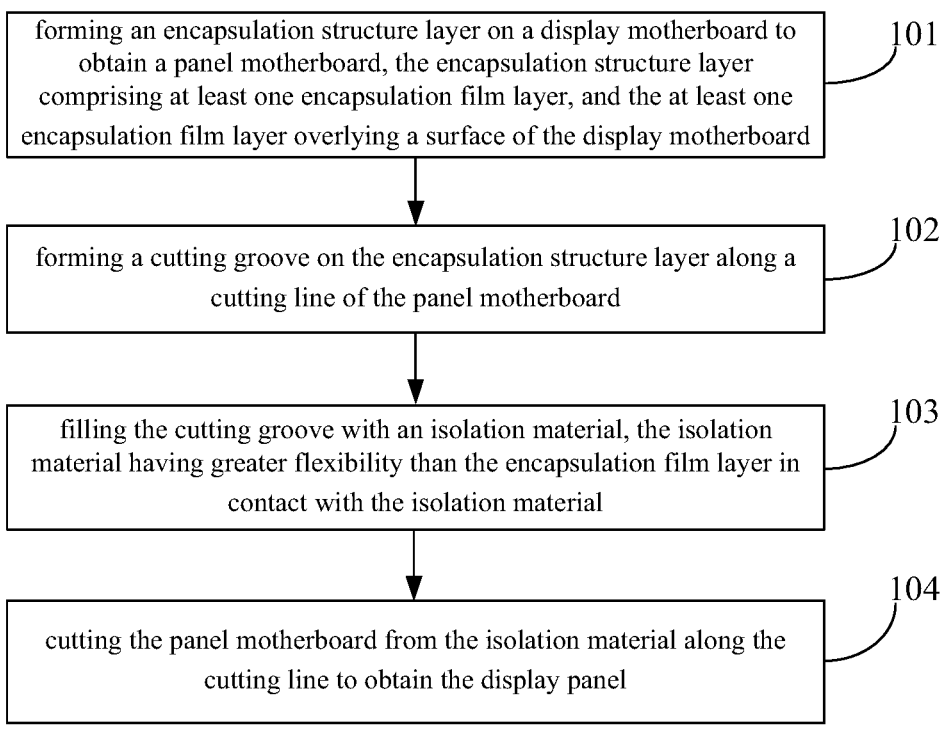
FIG. 1 is a flowchart of a method for manufacturing a display panel according to an embodiment of the present disclosure.

In order to make the principles and advantages of the present disclosure clearer, the present disclosure will be further described in detail below in conjunction with the accompanying drawings.

The OLED display panel is a display panel formed by cutting an OLED panel motherboard. The OLED panel motherboard includes a display motherboard and an encapsulation structure layer provided on the display motherboard. The display motherboard has a plurality of display areas, and each of the display areas is provided with an OLED device. The encapsulation structure layer includes a plurality of encapsulation structures in one-to-one correspondence with the plurality of display areas. Each of the encapsulation structures is used to encapsulate the OLED device in the corresponding display area, and each of the encapsulation structures includes an inorganic layer, an organic layer, and an inorganic layer which are superimposed.

At present, in the manufacturing process of an OLED display panel, an inorganic layer is firstly formed on a display motherboard using a chemical vapor deposition (CVD) process, the inorganic layer corresponds to each of a plurality of display areas, and the inorganic layer corresponding to each of the display areas is overlaid on an OLED device in each of the display areas, and then an organic layer is formed on the display motherboard on which the inorganic layer is formed using an ink-jet printing (IJP) process, and finally an inorganic layer is formed on the display motherboard on which the organic layer is formed using a CVD process, the inorganic layer corresponds to each of the display areas, and the inorganic layer corresponding to each of the display areas is overlaid on the organic layer corresponding to each of the display areas, thereby forming an encapsulation structure layer and obtaining an OLED panel motherboard. Then, the OLED panel motherboard is cut to obtain an OLED display panel. Herein, when the inorganic layer is formed using a CVD process, a mask may be provided on the display motherboard, so that the opening areas of the mask are in one-to-one correspondence with the display areas of the display motherboard, and then above the mask, an inorganic material is evaporated onto the display motherboard, and the inorganic material is deposited on the OLED device in each of the display areas through the opening areas of the mask, thereby forming the inorganic layer.

However, in the above solution, on the one hand, the outermost film layer of the encapsulation structure layer is an inorganic layer. In the process of cutting the OLED panel motherboard and handling the cut OLED display panel, a cutting tool and a manipulator may touch the inorganic layer, since the inorganic layer is brittle, the inorganic layer is easily cracked due to the touch, and the crack easily propagates in a certain direction, which results in the encapsulation failure of the encapsulation structure, and poor encapsulation effect of the encapsulation structure. On the other hand, in the process of forming the inorganic layer using a CVD process, under the effect of the precision of the mask and the precision of the evaporation, a margin area needs to be reserved at the edge of each of the display areas to compensate for evaporation deviation and evaporation shadow, which results in a wide border of the final cut OLED display panel, and thus it is difficult to achieve a narrow border display. Also, the cost of the Mask is high, and different masks are required for manufacturing OLED display panels of different specifications, which results in a high manufacturing cost of the OLED display panel.

With respect to the display panel and the manufacturing method therefor, and the display device according to the embodiments of the present disclosure, the manufacturing cost of the display panel is reduced, and the encapsulation effect of the encapsulation structure is improved. For detailed solutions of the present disclosure, reference is made to the following description of various embodiments.

Please refer to FIG. 1, which shows a flowchart of a method for manufacturing a display panel according to an embodiment of the present disclosure. The method may be used to manufacture an OLED display panel or a QLED display panel. Referring to FIG. 1, the method includes the following steps:

forming an encapsulation structure layer on a display motherboard to obtain a panel motherboard, the encapsulation structure layer comprising at least one encapsulation film layer, and the at least one encapsulation film layer overlying a surface of the display motherboard in step 101;

forming a cutting groove on the encapsulation structure layer along a cutting line of the panel motherboard in step 102;

filling the cutting groove with an isolation material, the isolation material having greater flexibility than the encapsulation film layer in contact with the isolation material in step 103; and cutting the panel motherboard from the isolation material along the cutting line to obtain the display panel in step 104.

In summary, with respect to the method for manufacturing a display panel according to the embodiment of the present disclosure, a cutting groove is formed on the encapsulation structure layer along the cutting line of the panel motherboard, and the cutting groove is filled with an isolation material, and the panel motherboard is cut from the isolation material along the cutting line to obtain a display panel. Since the isolation material has greater flexibility than the encapsulation film layers in contact with the isolation material, the isolation material can isolate the encapsulation film layer to avoid cracks in the encapsulation film layer during cutting and handling, which helps to solve the problem of poor encapsulation effect of the encapsulation structure and improve the encapsulation effect of the encapsulation structure. Furthermore, since the encapsulation film layer overlies the surface of the display motherboard, there is no need for use of a mask in the process of forming the encapsulation film layer, and thus there is no need to reserve a margin area, which facilitates to achieve a narrow border display of the display panel, and reduces the manufacturing cost of the display panel.

Optionally, after step 101, the method further includes: forming a protective seam on the encapsulation structure layer, the protective seam being located between a display area and the cutting line of the panel motherboard, and the depth direction of the protective seam being perpendicular to a surface of the encapsulation structure layer.

Optionally, after forming the protective seam on the encapsulation structure layer, the method further includes: filling the protective seam with the isolation material.

Optionally, forming the cutting groove on the encapsulation structure layer along the cutting line of the panel motherboard comprises: forming the cutting groove on the encapsulation structure layer along the cutting line of the panel motherboard using an etching process; and forming the protective seam on the encapsulation structure layer comprises: forming the protective seam on the encapsulation structure layer using an etching process.

Optionally, filling the cutting groove with the isolation material comprises: forming an isolation layer on the panel motherboard using the isolation material to fill the cutting groove with the isolation material.

Optionally, the isolation material is a polyimide material or an acrylic material.

Optionally, the panel motherboard has a non-display area and a display area, when the isolation material is a polyimide material, the isolation layer comprises an isolation area that overlies the non-display area; and when the isolation material is an acrylic material, the isolation layer comprises an isolation area that overlies the non-display area, or, the isolation layer overlies the surface of the panel motherboard.

Optionally, step 104 may include: cutting the panel motherboard from the isolation material along the cutting line using a laser cutting process.

Optionally, the at least one encapsulation film layer comprises an inorganic layer, an organic layer, and an inorganic layer which are sequentially superimposed, and step 101 may include: forming an inorganic layer on the display motherboard using a chemical vapor deposition process; forming an organic layer on the display motherboard on which the inorganic layer is formed using an ink jet printing process; and forming an inorganic layer on the display motherboard on which the organic layer is formed using a chemical vapor deposition process, thereby obtaining the encapsulation structure layer.

All of the selectable technique solutions described above, may be combined in any way to form alternative embodiments of the present disclosure, and will not be described again herein.

In summary, with respect to the method for manufacturing a display panel according to the embodiment of the present disclosure, a cutting groove is formed on the encapsulation structure layer along the cutting line of the panel motherboard, and the cutting groove is filled with an isolation material, and the panel motherboard is cut from the isolation material along the cutting line to obtain a display panel. Since the isolation material has greater flexibility than the encapsulation film layers in contact with the isolation material, the isolation material can isolate the encapsulation film layer to avoid cracks in the encapsulation film layer during cutting and handling, which helps to solve the problem of poor encapsulation effect of the encapsulation structure and improve the encapsulation effect of the encapsulation structure. Furthermore, since the encapsulation film layer overlies the surface of the display motherboard, there is no need for use of a mask in the process of forming the encapsulation film layer, and thus there is no need to reserve a margin area, which facilitates to achieve a narrow border display of the display panel, and reduces the manufacturing cost of the display panel.

Figure 2:
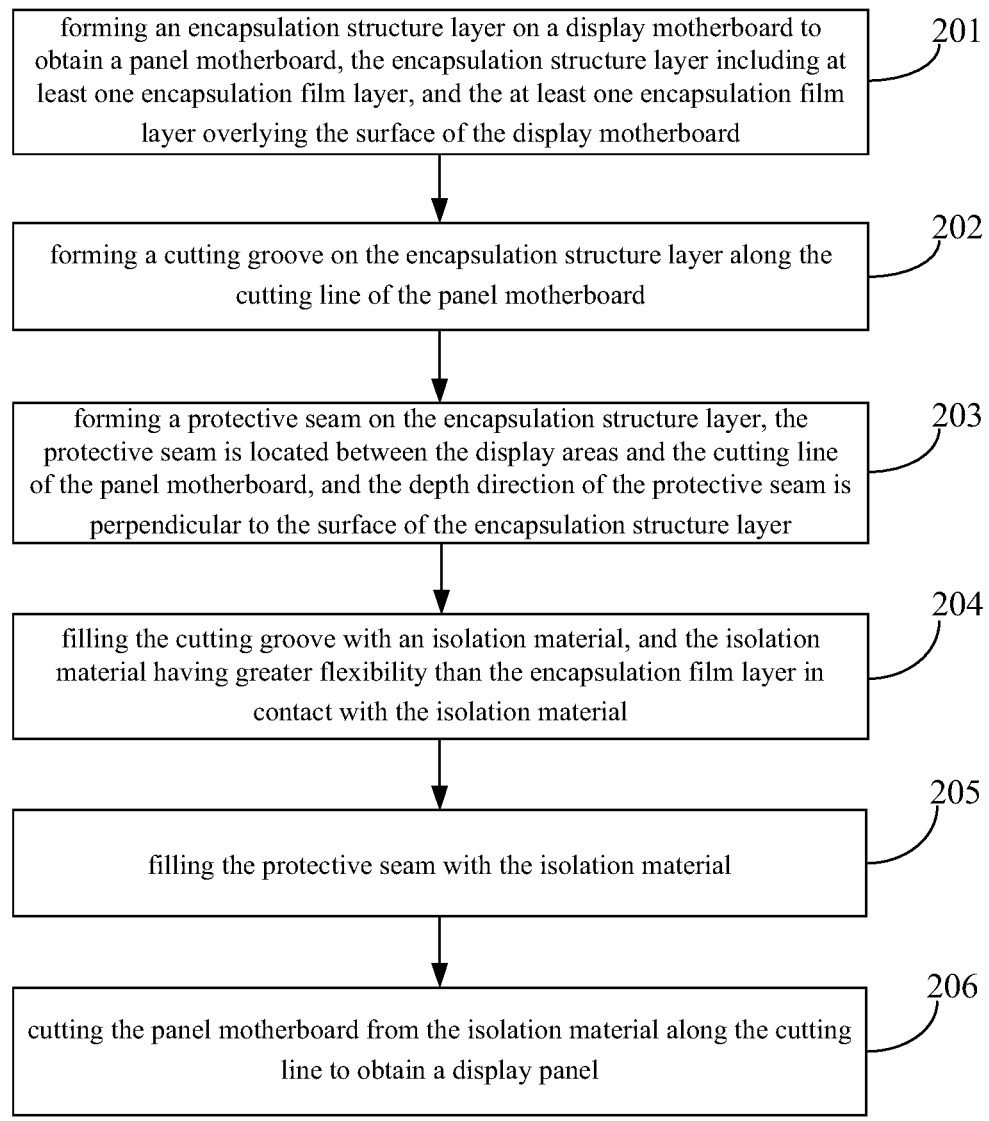
FIG. 2 is a flowchart of another method for manufacturing another display panel according to an embodiment of the present disclosure.

Referring to FIG. 2, which shows a flow chart of another method for manufacturing a display panel according to an embodiment of the present disclosure. The method for manufacturing a display panel may be used to manufacture an OLED display panel or a QLED display panel. Referring to FIG. 2, the method for manufacturing a display panel includes steps 201, 202, 203, 204, 205, and 206.

In step 201, an encapsulation structure layer is formed on a display motherboard to obtain a panel motherboard. The encapsulation structure layer includes at least one encapsulation film layer, and the at least one encapsulation film layer overlies the surface of the display motherboard.

Figure 3:
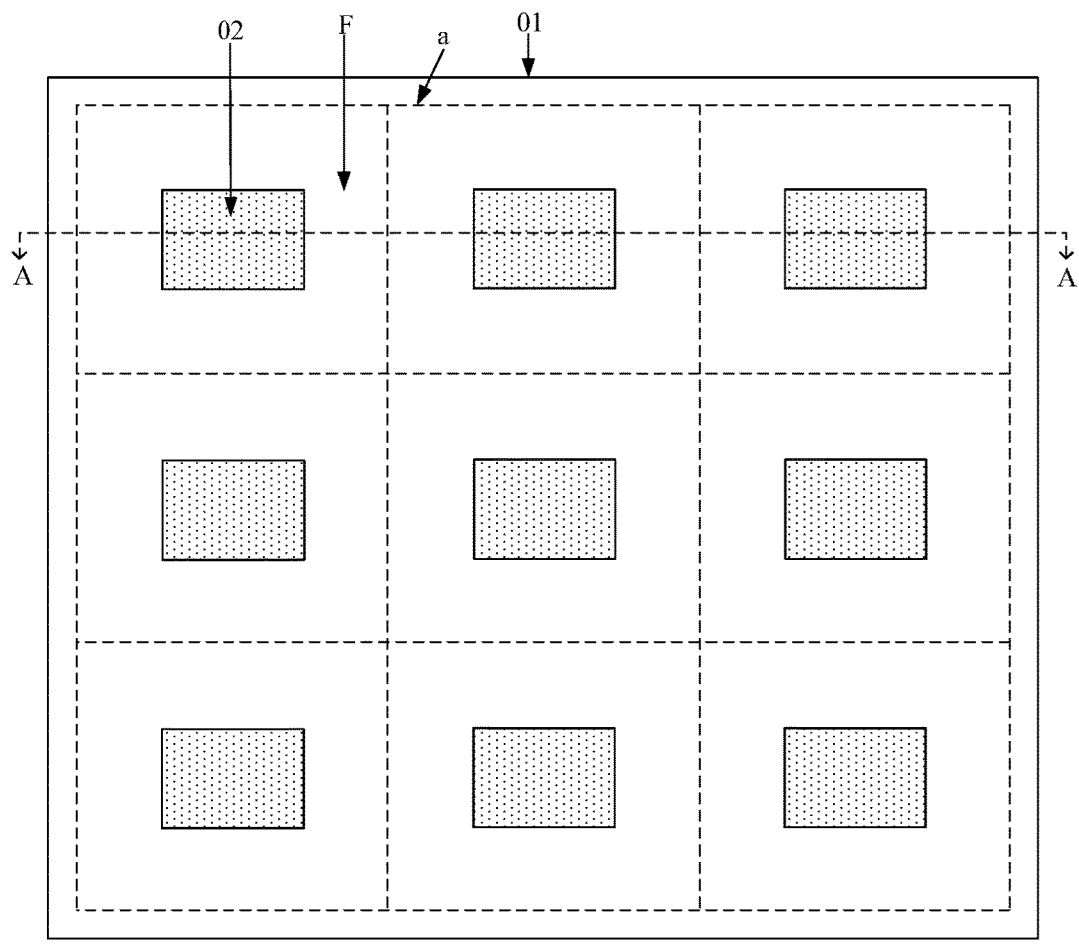
FIG. 3 is a top view of a display motherboard according to an embodiment of the present disclosure.
Figure 4:
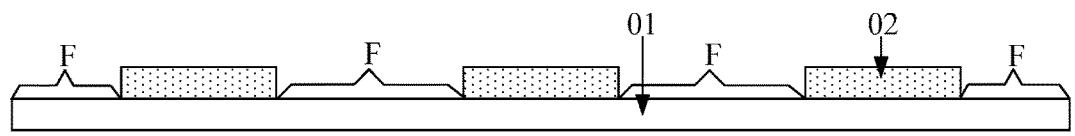
FIG. 4 is a sectional view of a display motherboard according to an embodiment of the present disclosure.

FIG. 3 is a top view of a display motherboard 01 according to an embodiment of the present disclosure, and FIG. 4 is a sectional view of the A-A portion of the display motherboard 01 shown in FIG. 3. Referring to FIGS. 3 and 4, the display motherboard 01 has a non-display area F and a plurality of display areas (not shown in FIGS. 3 and 4), and each of the display areas is provided with a display device 02. The display device 02 may be an OLED device or a QLED device. The display motherboard 01 is also provided with a cutting line a, and the cutting line a of the display motherboard 01 is located in the non-display area F.

Optionally, the display motherboard 01 may include a base substrate (not shown in FIGS. 3 and 4) and a barrier layer (not shown in FIGS. 3 and 4) provided on the base substrate. The base substrate may be a rigid transparent substrate made of a non-metallic material such as glass, quartz or transparent resin which is sturdy and light-conductive, or the base substrate may be a flexible substrate made of a material such as polyimide (PI).

Figure 5:
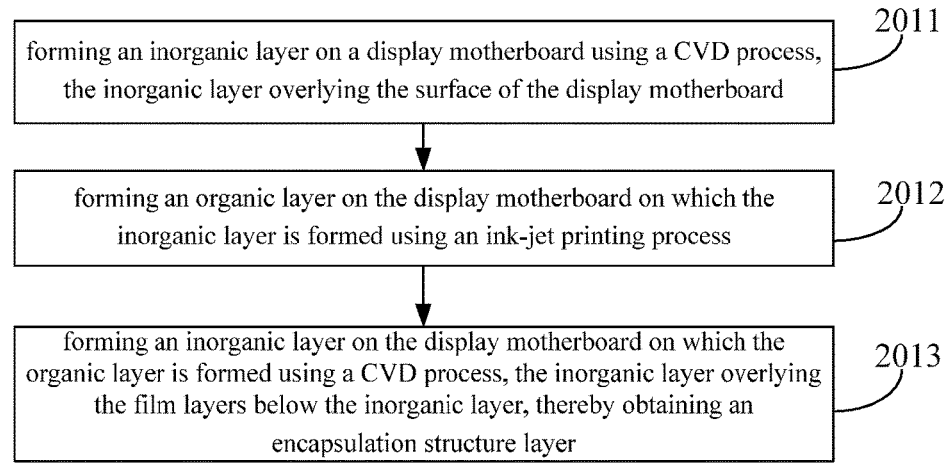
FIG. 5 is a flowchart of a method for forming an encapsulation structure layer on a display motherboard according to an embodiment of the present disclosure.

In the embodiment of the present disclosure, the at least one encapsulation film layer of the encapsulation structure layer may include an inorganic layer, an organic layer, and an inorganic layer which are sequentially superimposed, and the inorganic layer may overlie the surface of the display motherboard. Referring to FIG. 5, which shows a flow chart of a method for forming an encapsulation structure layer on a display motherboard according to an embodiment of the present disclosure. Referring to FIG. 5, the method includes the following operating processes.

In step 2011, an inorganic layer is formed on a display motherboard using a CVD process, and the inorganic layer overlies the surface of the display motherboard.

Figure 6:
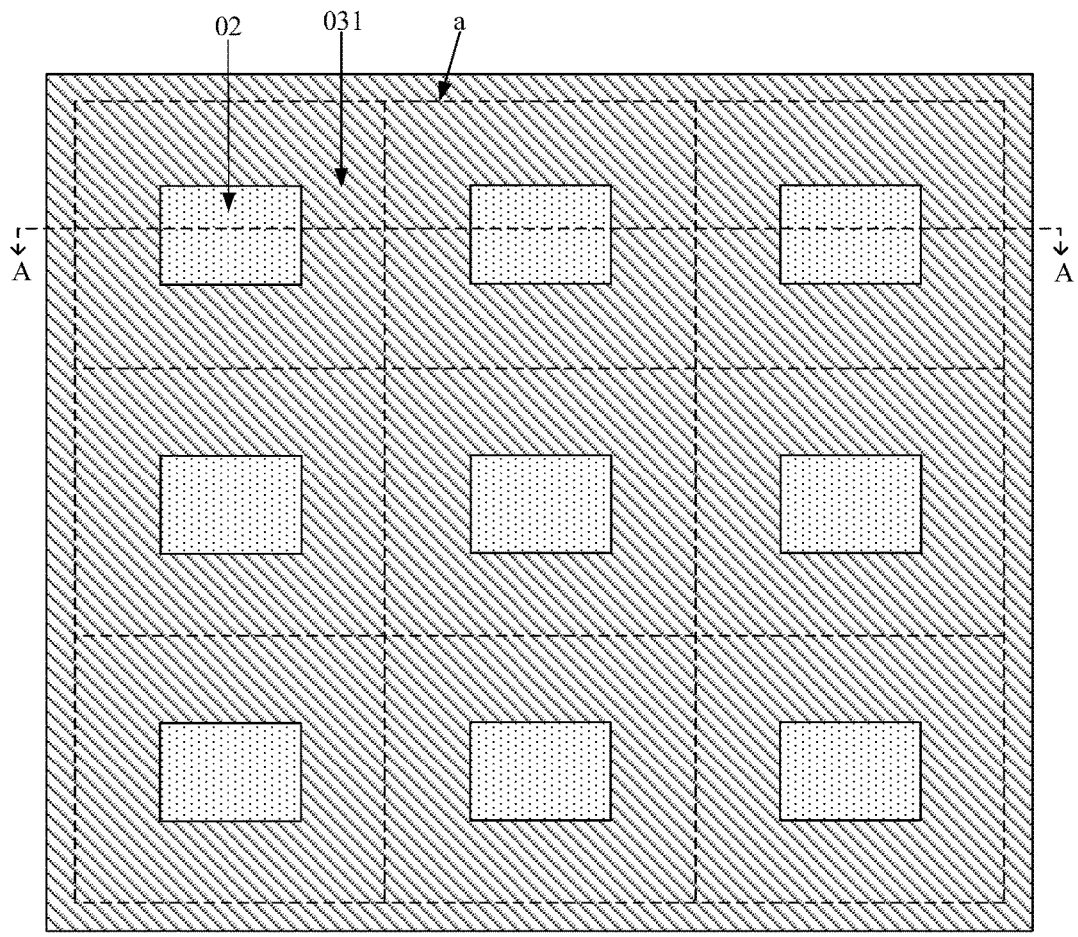
FIG. 6 is a top view of a display motherboard after an inorganic layer is formed according to an embodiment of the present disclosure.
Figure 7:
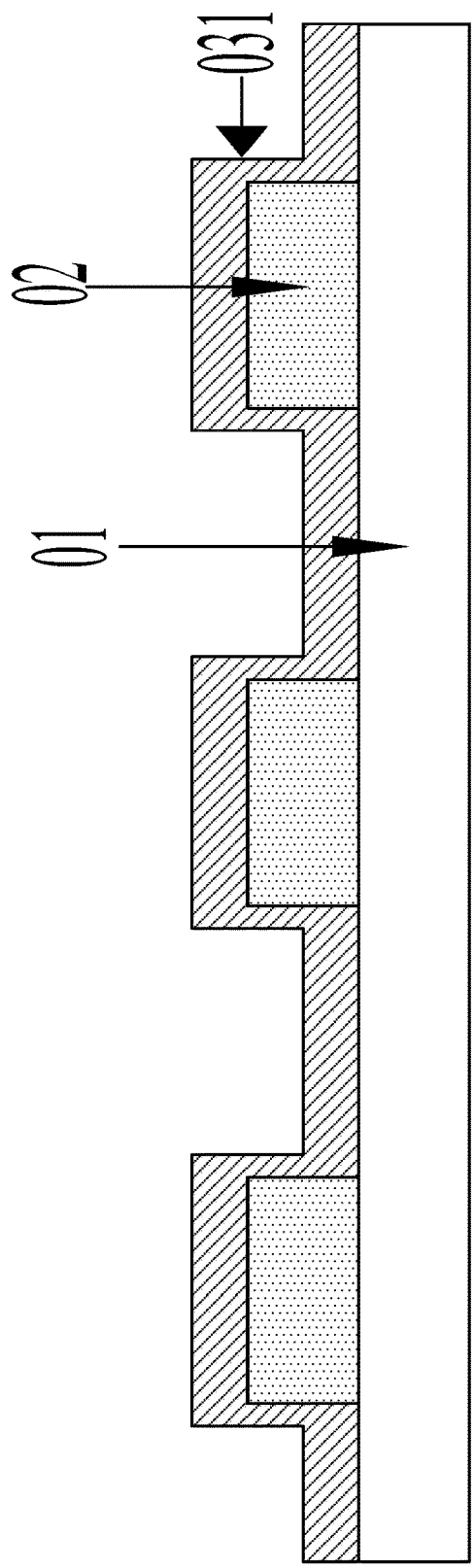
FIG. 7 is a sectional view of a display motherboard after an inorganic layer is formed according to an embodiment of the present disclosure.

FIG. 6 is a top view after forming an inorganic layer 031 on the display motherboard 01 according to an embodiment of the present disclosure, and FIG. 7 is a sectional view of the A-A portion of the display motherboard shown in FIG. 6. Referring to FIGS. 6 and 7, an inorganic layer 031 is overlaid on the surface of the display motherboard 01 which is provided with a display device 02, and the inorganic layer 031 is an integral structure. In other words, the inorganic layer 031 is integrally overlaid on the surface of the display motherboard 01 which is provided with the display device 02. The inorganic layer 031 may be formed of an inorganic material such as silicon nitride (SiNx) or silicon oxynitride (SiNO). Exemplarily, the display motherboard 01 may be provided in a deposition chamber, and then SiNx gas may be input into the deposition chamber, the SiNx gas is diffused and deposited on the non-display area F and the display device 02 of the display motherboard 01 within the deposition chamber, and thus the inorganic layer 031 is formed.

Optionally, the inorganic layer 031 may be formed on the display motherboard 01 using a CVD process. In the embodiment of the present disclosure, exemplarily, the CVD process may be a plasma enhanced chemical vapor deposition (PECVD) process.

In step 2012, an organic layer is formed on the display motherboard on which the inorganic layer is formed using an ink-jet printing process.

Figure 8:
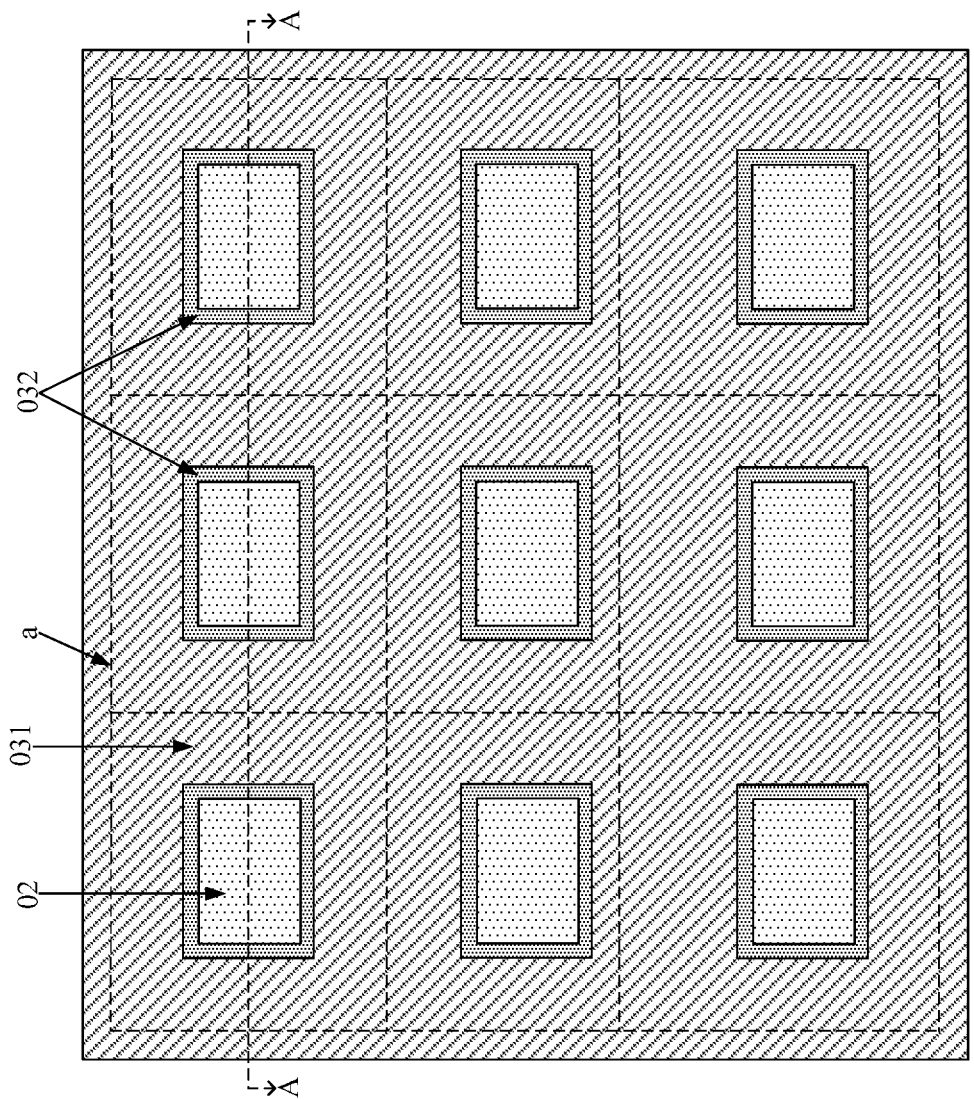
FIG. 8 is a top view of a display motherboard on which an inorganic layer is formed after an organic layer is formed according to an embodiment of the present disclosure.
Figure 9:
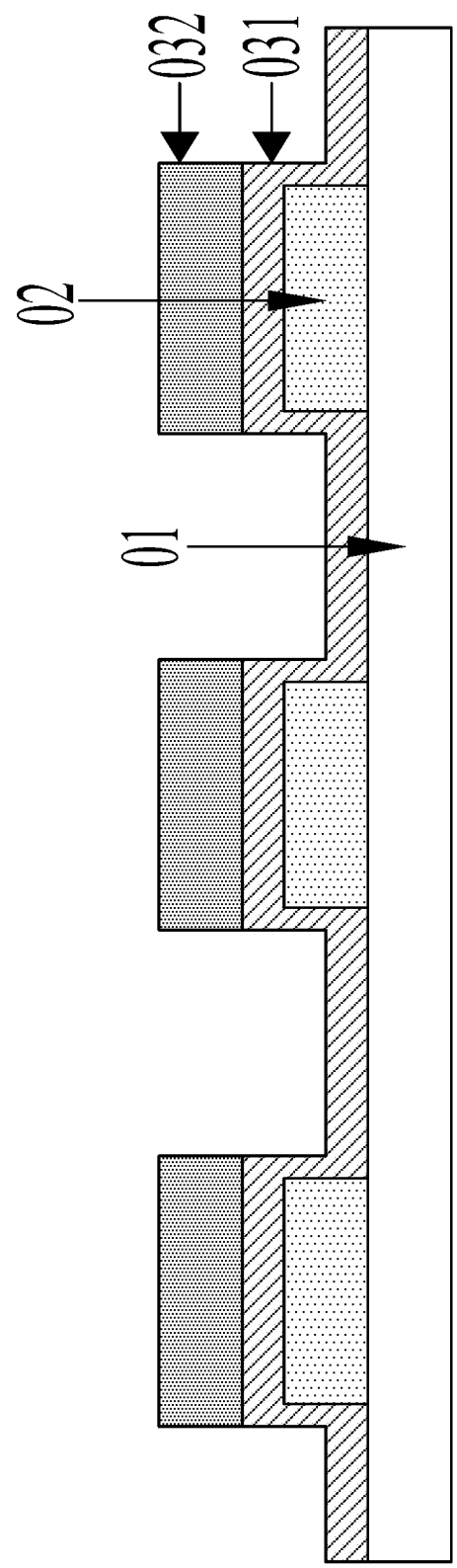
FIG. 9 is a sectional view of a display motherboard on which an inorganic layer is formed after an organic layer is formed according to an embodiment of the present disclosure.

FIG. 8 is a top view after forming an organic layer 032 formed on the display motherboard 01 on which the inorganic layer 031 is formed according to an embodiment of the present disclosure, and FIG. 9 is a sectional view of the A-A portion of the display motherboard shown in FIG. 8. Referring to FIGS. 8 and 9, the organic layer 032 is located on the inorganic layer 031, and the organic layer 032 includes a plurality of organic layer areas (not shown in FIGS. 8 and 9), the plurality of organic layer areas are in one-to-one correspondence with a plurality of display devices 02, and the orthographic projection of each of the organic layer areas on the display motherboard 01 overlies the corresponding display device 02. The organic layer 032 may be formed of an acrylic material. Optionally, the ink may be formed using an acrylic material, and then the ink may be sprayed on the inorganic layer 031 using an ink-jet printing process. The ink forms the organic layer 032 on the inorganic layer 031.

In step 2013, an inorganic layer is formed on the display motherboard on which the organic layer is formed using a CVD process, and the inorganic layer overlies the film layers below the inorganic layer, thereby obtaining an encapsulation structure layer.

Figure 10:
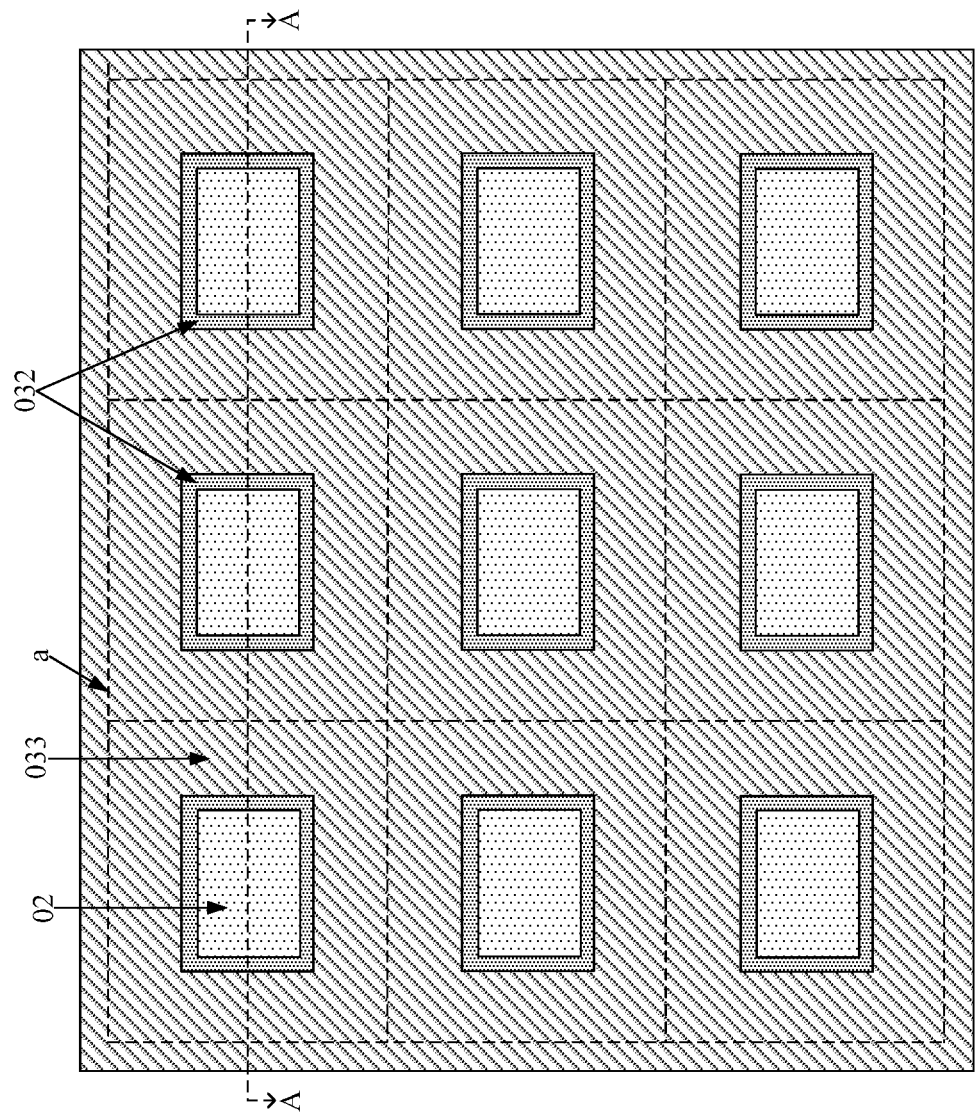
FIG. 10 is a top view of a display motherboard on which an organic layer is formed after an inorganic layer is formed according to an embodiment of the present disclosure.
Figure 11:
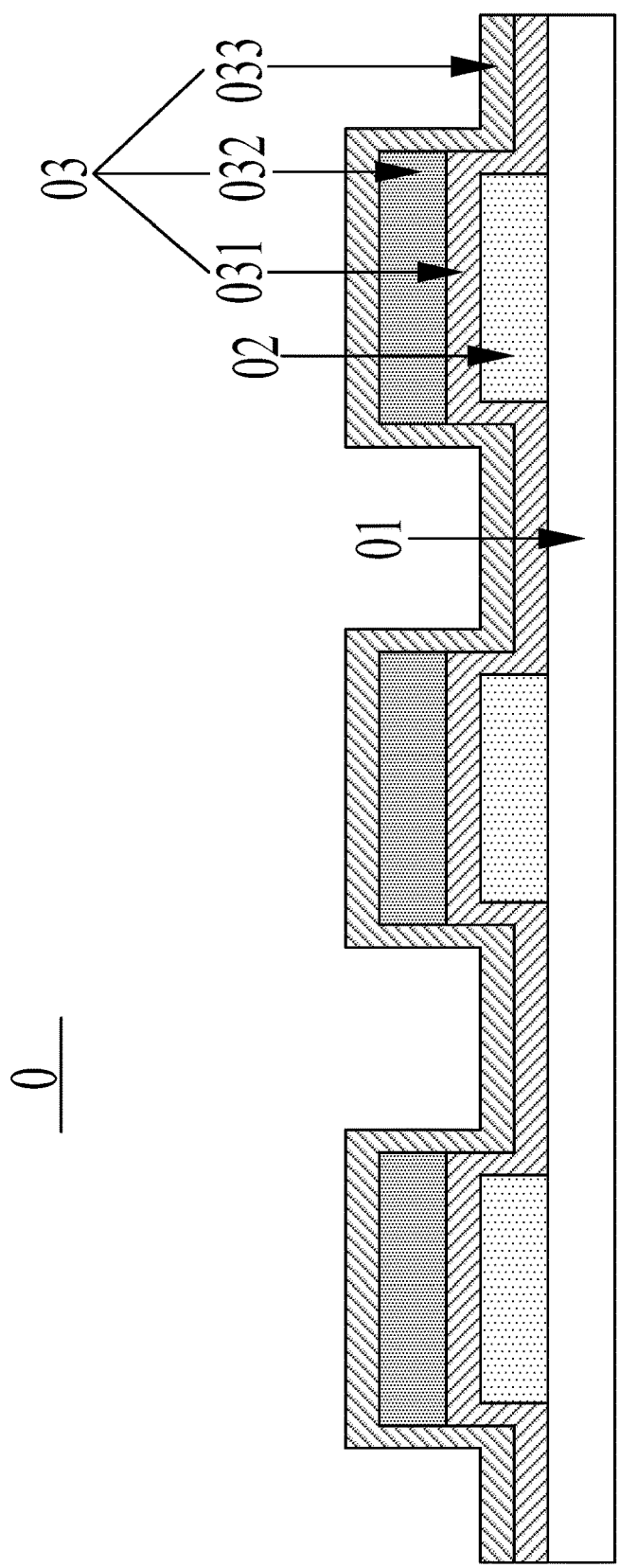
FIG. 11 is a sectional view of a display motherboard on which an organic layer is formed after an inorganic layer is formed according to an embodiment of the present disclosure.

FIG. 10 is a top view after forming an inorganic layer 033 on the display motherboard 01 on which the organic layer 032 is formed according to an embodiment of the present disclosure, and FIG. 11 is a sectional view of the A-A portion of the display motherboard shown in FIG. 10. Referring to FIGS. 10 and 11, the film layers below the inorganic layer 033 includes an inorganic layer 031 and an organic layer 032, and the inorganic layer 033 overlies the inorganic layer 031 and the organic layer 032. In the embodiment of the present disclosure, after the inorganic layer 031, the organic layer 032, and the inorganic layer 033 are formed, the encapsulation structure layer 03 is obtained. After the encapsulation structure layer 03 is formed on the display motherboard 01, the panel motherboard 0 is obtained. The formation process of the inorganic layer 033 may refer to the formation process of the inorganic layer 031, which will not be described here in the embodiment of the present disclosure.

Exemplarily, the embodiment of the present disclosure is described by taking a case where the encapsulation structure layer 03 includes an inorganic layer 031, an organic layer 032, and an inorganic layer 033 as an example. Optionally, the encapsulation structure layer may also include a plurality of inorganic layers and a plurality of organic layers, and the inorganic layers and the organic layers are alternately superimposed. In the encapsulation structure layer, the film layers closest to and farthest from the display motherboard may be inorganic layers, which is not limited in the embodiment of the present disclosure.

In the embodiment of the present disclosure, since the inorganic layer of the encapsulation structure layer 03 overlies the surface of the display motherboard 01, the use of the mask can be avoided, and it is not necessary to reserve a margin area at the edge of each of the display areas of the display motherboard 01, which facilitates to achieve a narrow border display of the resulting display panel, reduces the manufacturing cost of the display panel, and improves the reliability of the display panel.

In step 202, a cutting groove is formed on the encapsulation structure layer along the cutting line of the panel motherboard.

Figure 12:
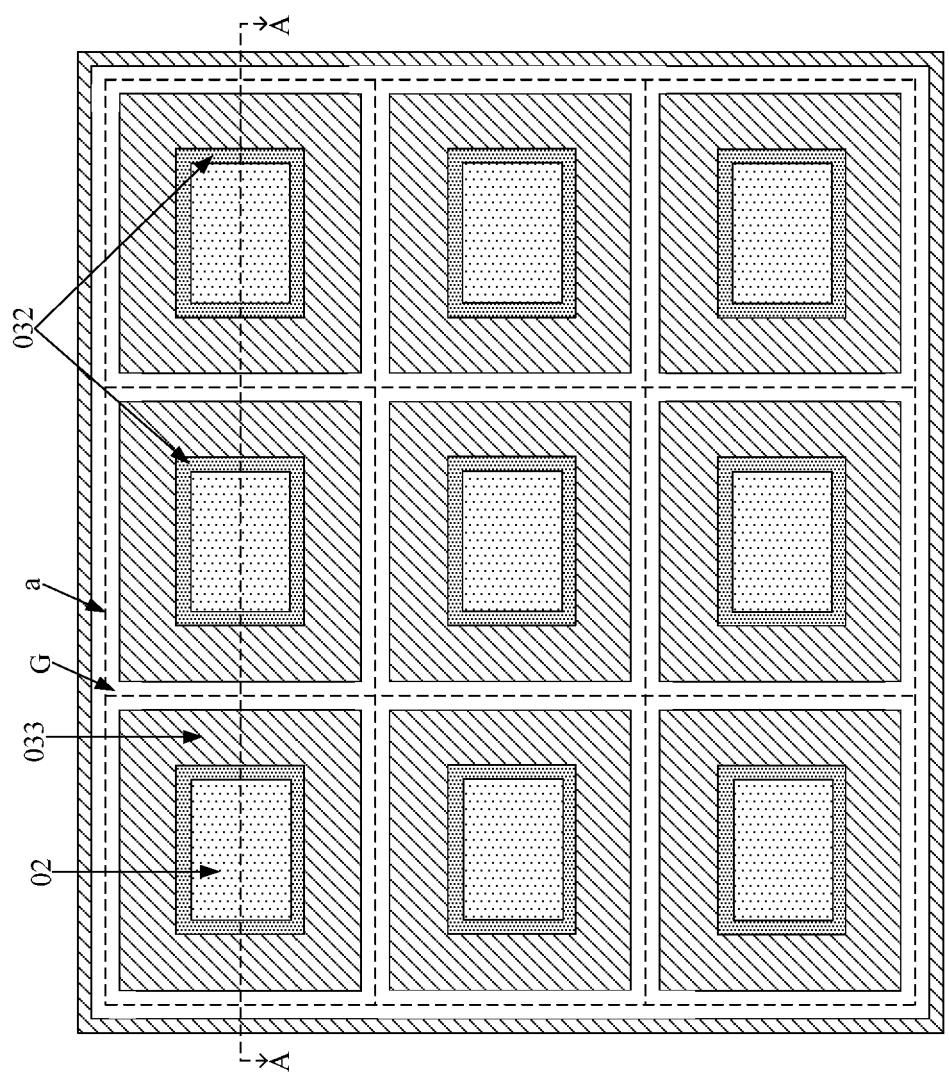
FIG. 12 is a top view of an encapsulation structure layer after a cutting groove is formed according to an embodiment of the present disclosure.
Figure 13:
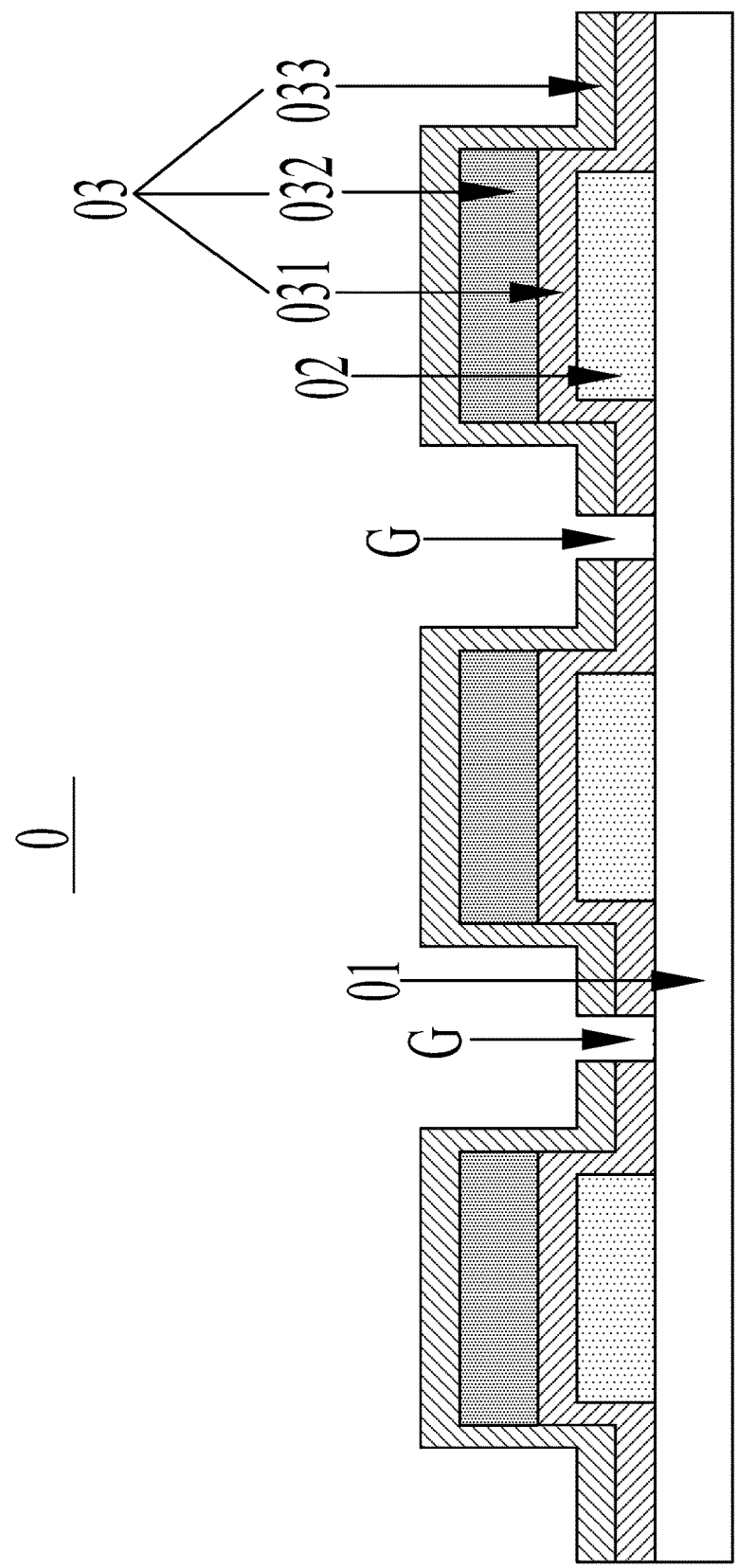
FIG. 13 is a sectional view of an encapsulation structure layer after a cutting groove is formed according to an embodiment of the present disclosure.

FIG. 12 is a top view after forming a cutting groove G on the encapsulation structure layer 03 along the cutting line of the panel motherboard 0 according to an embodiment of the present disclosure, and FIG. 13 is a sectional view of the AA portion of the panel motherboard shown in FIG. 12. In the embodiment of the present disclosure, the cutting line of the panel motherboard 0 may be collinear with the cutting line a of the display motherboard 01, therefore, the cutting line a of the display motherboard 01 is also the cutting line of the panel motherboard 0. Referring to FIGS. 12 and 13, the cutting groove G is provided along the cutting line a of the panel motherboard 0. In the embodiment of the present disclosure, the cutting groove G may extend through the encapsulation structure layer 03, or may not extend through the encapsulation structure layer 03. FIGS. 12 and 13 are described by taking a case where the cutting groove G extends through the encapsulation structure layer 03 as an example. In FIGS. 12 and 13, the cutting groove G extends through the inorganic layer 031 and the inorganic layer 033. Optionally, when the organic layer 032 has a large area, the cutting groove G may also extend through the organic layer 032.

Exemplarily, in the embodiment of the present disclosure, the cutting groove G may be formed on the encapsulation structure layer 03 along the cutting line a of the panel motherboard 0 using an etching process. Optionally, a layer of photoresist may be coated on the encapsulation structure layer 03, and then the photoresist is exposed using a mask to form a fully exposed area and a non-exposed area. Herein, the fully exposed area corresponds to the area on the encapsulation structure layer 03 on which the cutting groove G is to be formed, and the non-exposed area corresponds to other areas of the encapsulation structure layer 03. A development process is then carried out so that the photoresist in the fully exposed area is removed and the photoresist in the non-exposed area remains. Thereafter, the area on the encapsulation structure layer 03 corresponding to the fully exposed area is etched to form the cutting groove G. Finally, the photoresist in the non-exposed area is stripped. The embodiment of the present disclosure is described by taking a case where the photoresist is a positive photoresist as an example. Optionally, the photoresist may also be a negative photoresist, which will not be described here in the embodiment of the present disclosure. In the embodiment of the present disclosure, the encapsulation structure layer 03 may be etched using dry etching or wet etching.

In step 203, a protective seam is formed on the encapsulation structure layer, the protective seam is located between the display areas and the cutting line of the panel motherboard, and the depth direction of the protective seam is perpendicular to the surface of the encapsulation structure layer.

Figure 14:
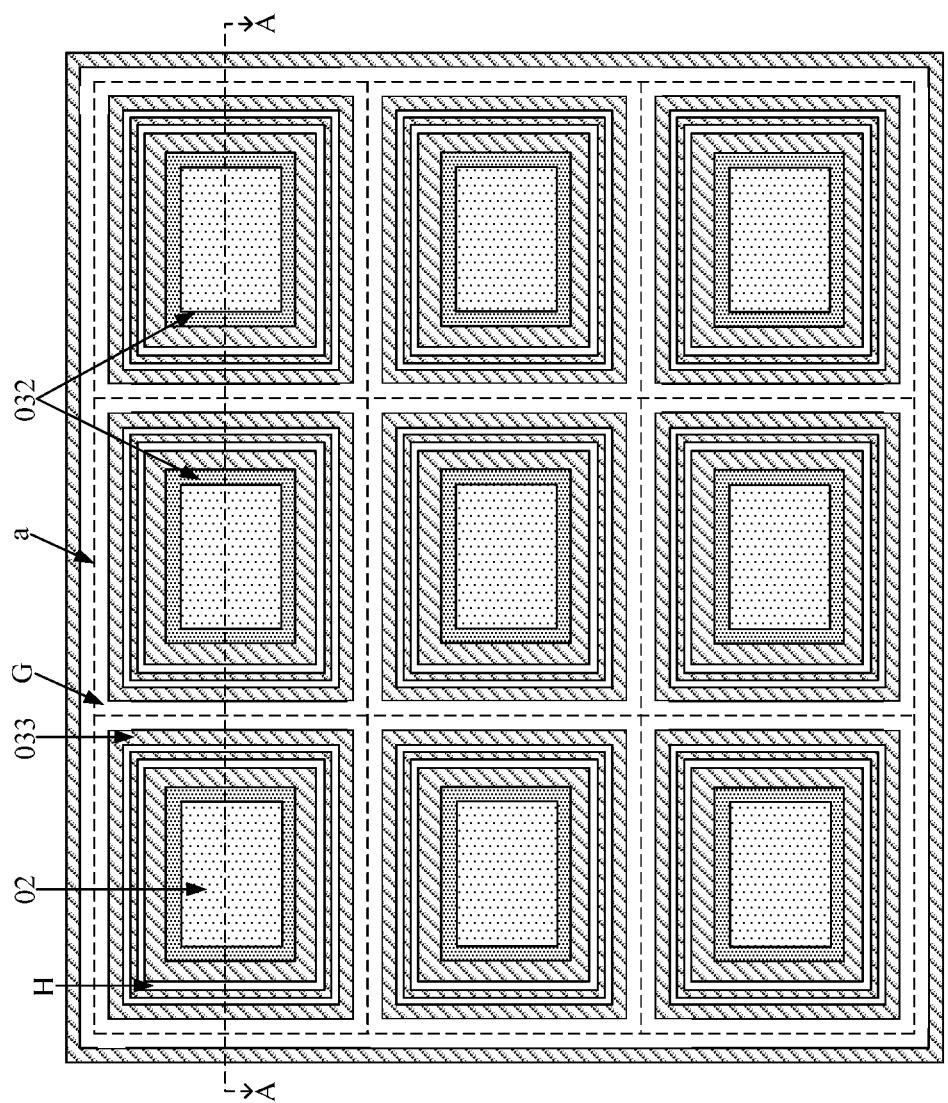
FIG. 14 is a top view of an encapsulation structure layer after a protective seam is formed according to an embodiment of the present disclosure.
Figure 15:
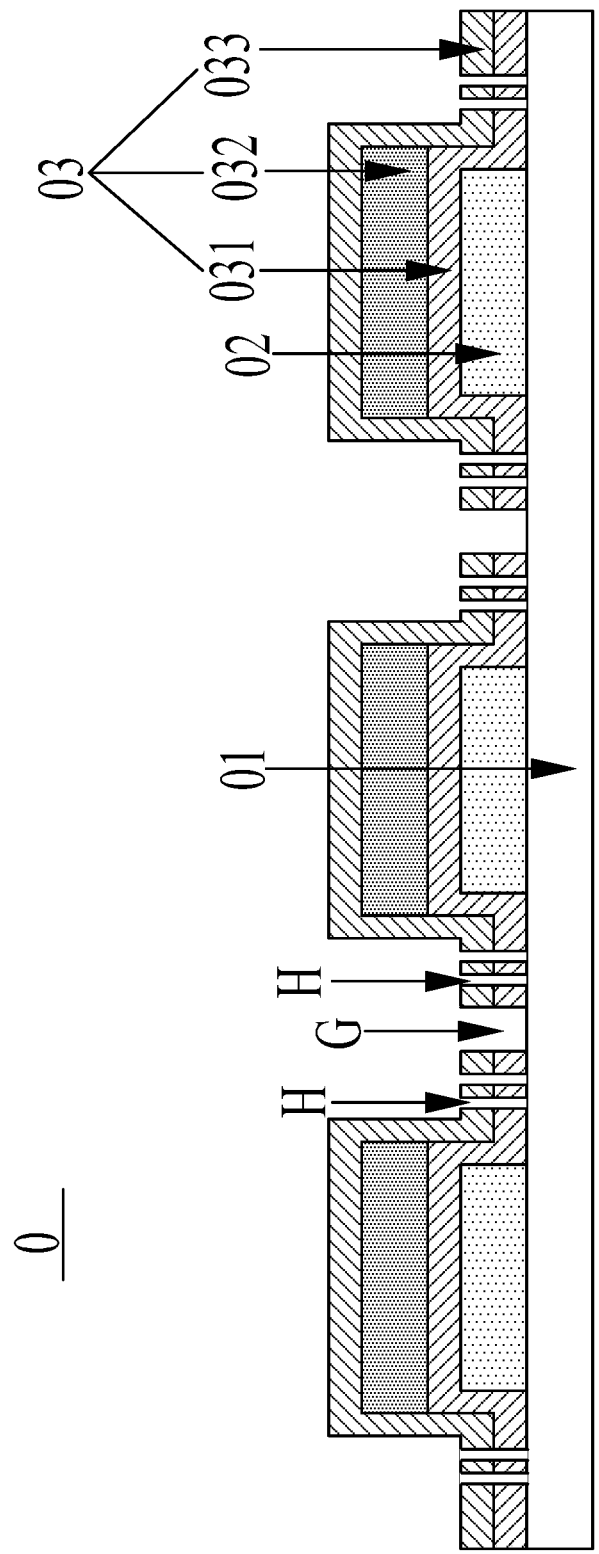
FIG. 15 is a sectional view of an encapsulation structure layer after a protective seam is formed according to an embodiment of the present disclosure.

FIG. 14 is a top view after forming a protective seam H on the encapsulation structure layer 03 according to an embodiment of the present disclosure, and FIG. 15 is a sectional view of the A-A portion of the panel motherboard shown in FIG. 14. Referring to FIGS. 14 and 15, the protective seam H is located between the display areas (not shown in FIGS. 14 and 15) of the panel motherboard 0 and the cutting line a of the panel motherboard 0, and the depth direction (not shown in FIGS. 14 and 15) of the protective seam H is perpendicular to the surface (not shown in FIGS. 14 and 15) of the encapsulation structure layer 03. In the embodiment of the present disclosure, the protective seam H may extend through the encapsulation structure layer 03. For example, as shown in FIGS. 14 and 15, the protective seam H extends through the inorganic layer 031 and the inorganic layer 033. Optionally, when the organic layer 032 has a large area, the protective seam H may also extend through the organic layer 032.

In the embodiment of the present disclosure, the protective seam H may be formed on the encapsulation structure layer 03 using an etching process. The detailed implementation process is similar to the above-mentioned process of forming the cutting groove G, which will not be described here in the embodiment of the present disclosure.

Exemplarily, the embodiment of the present disclosure is described by taking a case where the process of forming the cutting groove G and the process of forming the protective seam H are independent of each other as an example. Optionally, the cutting groove G and the protective seam H may also be formed at the same time, that is, the cutting groove G and the protective seam H may be formed at the same time by one etching process, and thus the step 202 and step 203 above may be combined into one step, which is not limited in the embodiment of the present disclosure.

In step 204, the cutting groove is filled with an isolation material, and the isolation material has greater flexibility than the encapsulation film layer in contact with the isolation material.

Figure 16:
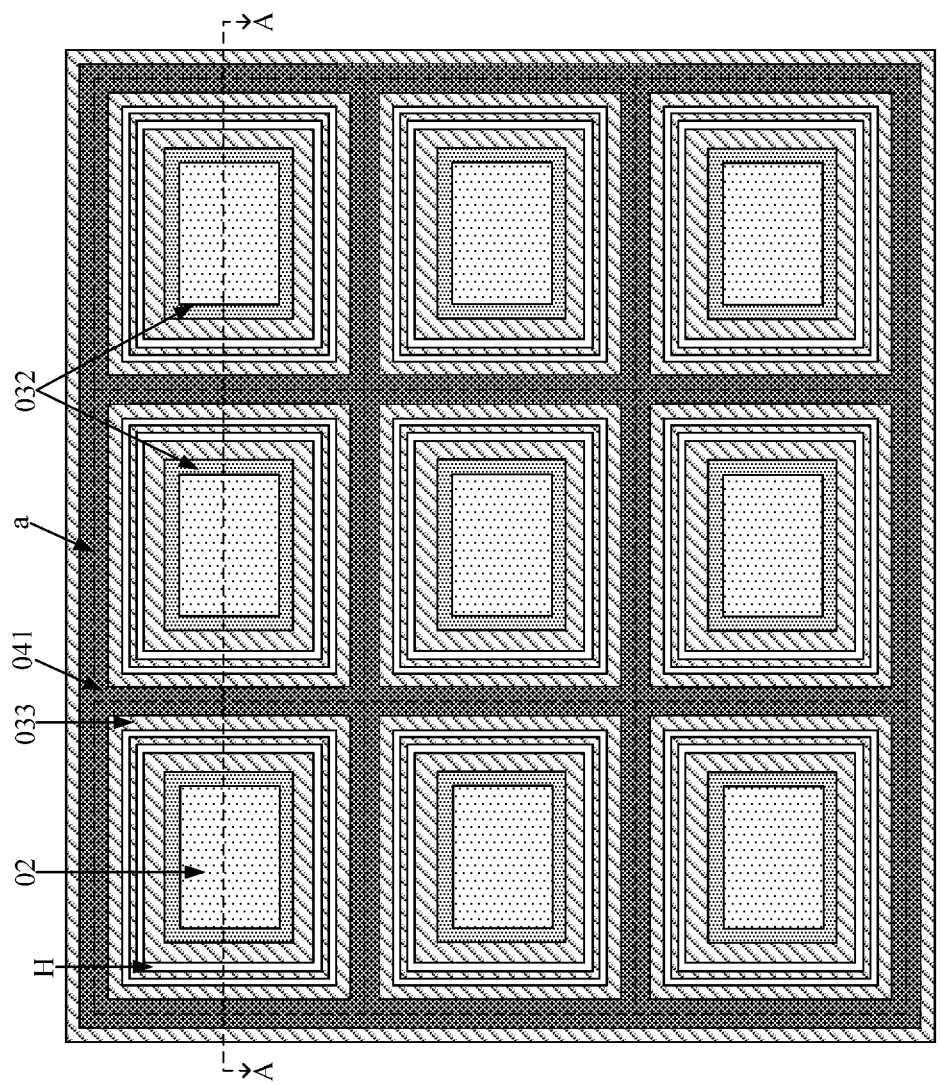
FIG. 16 is a top view after a cutting groove is filled with an isolation material according to an embodiment of the present disclosure.
Figure 17:
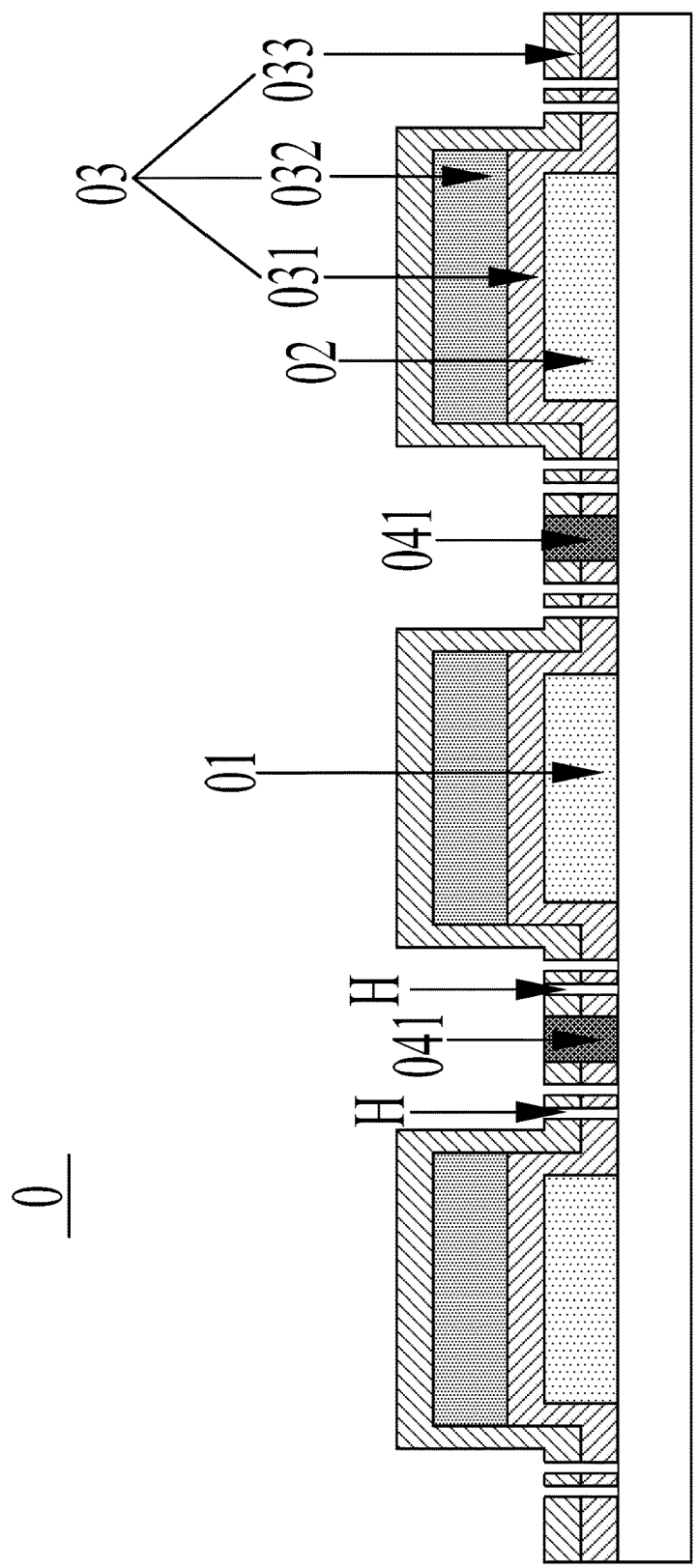
FIG. 17 is a sectional view after a cutting groove is filled with an isolation material according to an embodiment of the present disclosure

FIG. 16 is a top view after filling the cutting groove G with an isolation material 041 according to an embodiment of the present disclosure, and FIG. 17 is a sectional view of the A-A portion of the panel motherboard shown in FIG. 16. Referring to FIGS. 16 and 17, the cutting groove G is filled with the isolation material 041, and the isolation material 041 may have greater flexibility than the encapsulation film layer in contact with the isolation material 041. As shown in FIGS. 16 and 17, the encapsulation film layers in contact with the isolation material 041 are the inorganic layer 031 and the inorganic layer 033. Therefore, the isolation material 041 has greater flexibility than the inorganic layer 031 and the inorganic layer 033. In the embodiment of the present disclosure, the isolation material 041 may be a PI material or an acrylic material. Optionally, the isolation material 041 may be filled in the cutting groove G using an ink-jet printing process. Of course, the isolation material 041 may also be filled in the cutting groove G using other processes, which is not limited in the embodiment of the present disclosure.

In step 205, the protective seam is filled with the isolation material.

Figure 18:
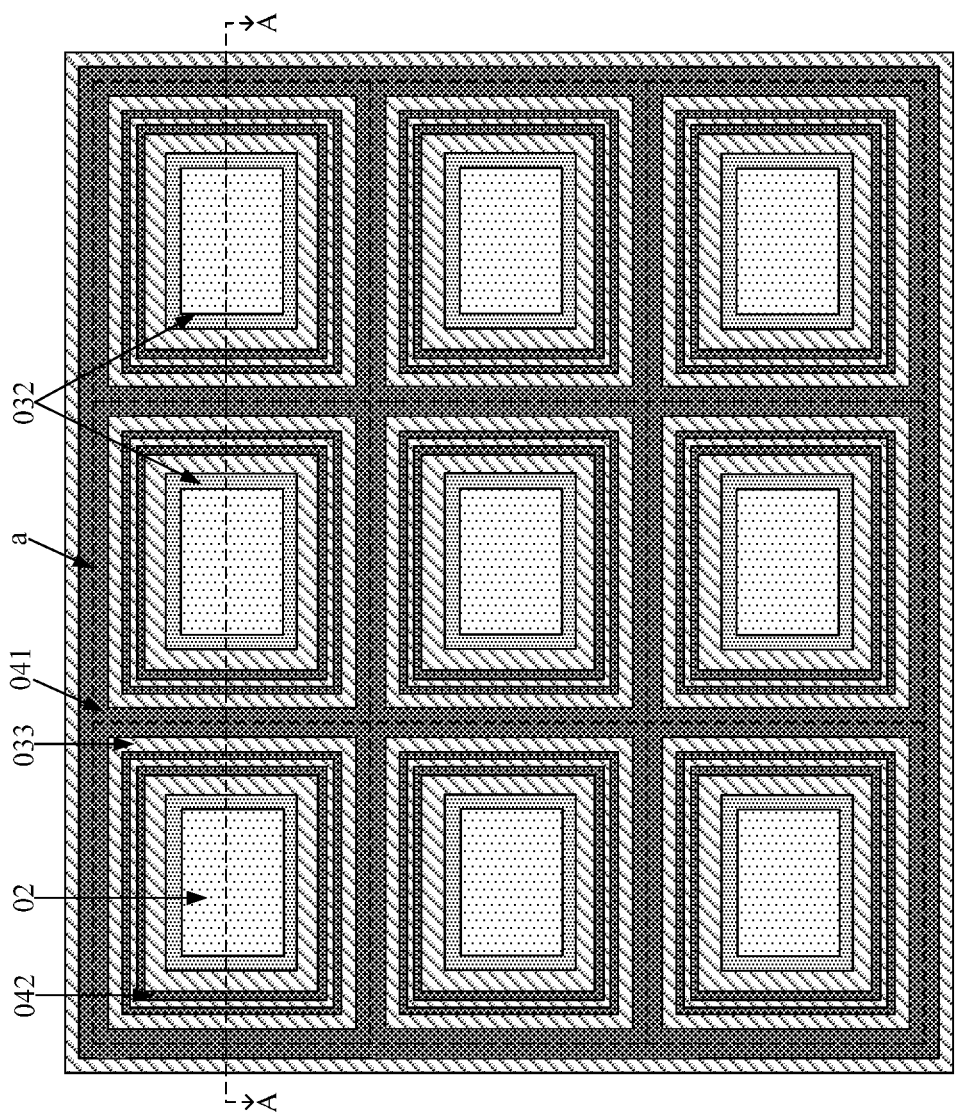
FIG. 18 is a top view after a protective seam is filled with an isolation material according to an embodiment of the present disclosure.
Figure 19:
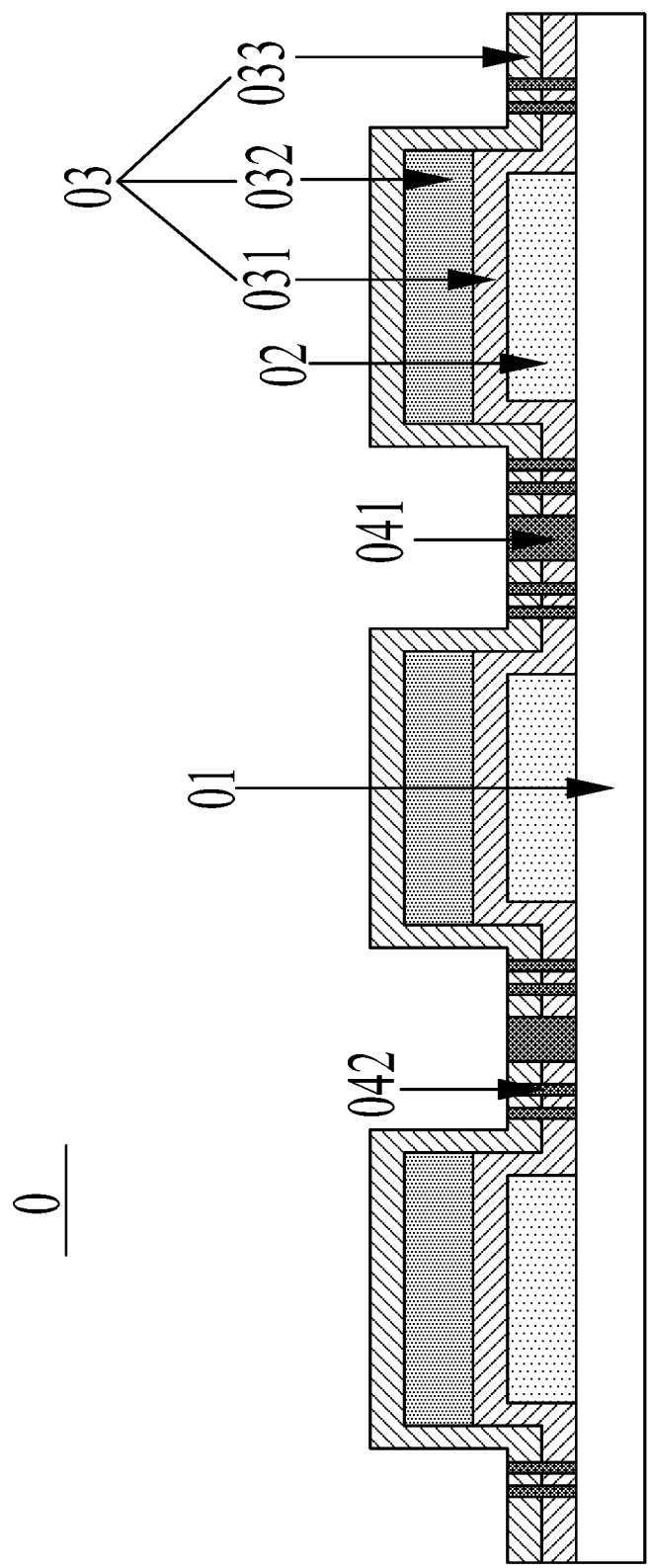
FIG. 19 is a sectional view after a protective seam is filled with an isolation material according to an embodiment of the present disclosure.

FIG. 18 is a top view after filling the protective seam H with the isolation material 042 according to an embodiment of the present disclosure, and FIG. 19 is a sectional view of the A-A portion of the panel motherboard shown in FIG. 18.

Referring to FIGS. 18 and 19, the protective seam H is filled with the isolation material 042. In the embodiment of the present disclosure, the isolation material 042 may be a PI material or an acrylic material. The isolation material 042 and the isolation material 041 filled in the cutting groove may be the same or different. Optionally, the isolation material 042 may be filled in the protective seam H using an ink-jet printing process. Of course, the isolation material 042 may also be filled in the protective seam H using other processes, which is not limited in the embodiment of the present disclosure.

Exemplarily, the embodiment of the present disclosure is described by taking a case where the process in which the isolation material 041 is filled in the cutting groove G and the process in which the isolation material 042 is filled in the protective seam H are independent of each other as an example. Optionally, when the isolation material 041 and the isolation material 042 are the same, the isolation material may also be filled in the cutting groove G and the protective seam H at the same time, that is, the step 204 and step 205 above may be combined into one step.

Optionally, when the step 204 and step 205 above are combined into one step, filling the cutting groove G with the isolation material may include: forming an isolation layer on the panel motherboard 0 using the isolation material to fill the cutting groove G with the isolation material. In the process of filling the cutting groove G with the isolation material, the protective seam H is also filled with the isolation material. In the embodiment of the present disclosure, the isolation material may be a PI material or an acrylic material. The panel motherboard 0 has a non-display area and display areas. The display areas of the panel motherboard 0 correspond to the display areas of the display motherboard 01, and the non-display area of the panel motherboard 0 is the area other than the display areas on the display motherboard 01. When the isolation material is a PI material, since the PI material is a non-transparent material, in order to avoid the influence of the isolation layer on the light-emitting performance of the resulting display panel, the isolation layer may include opening areas and an isolation area, the opening areas correspond to the display areas of the panel motherboard 0, and the isolation area overlies the non-display area of the panel motherboard 0. When the isolation material is an acrylic material, the isolation layer may include opening areas and an isolation area, the opening areas correspond to the display areas of the panel motherboard 0, and the isolation area overlies the non-display area of the panel motherboard 0. Or, the isolation layer overlies the surface of the panel motherboard 0. In other words, the display areas and the non-display area of the panel motherboard 0 are overlaid with the isolation layer.

Figure 20:
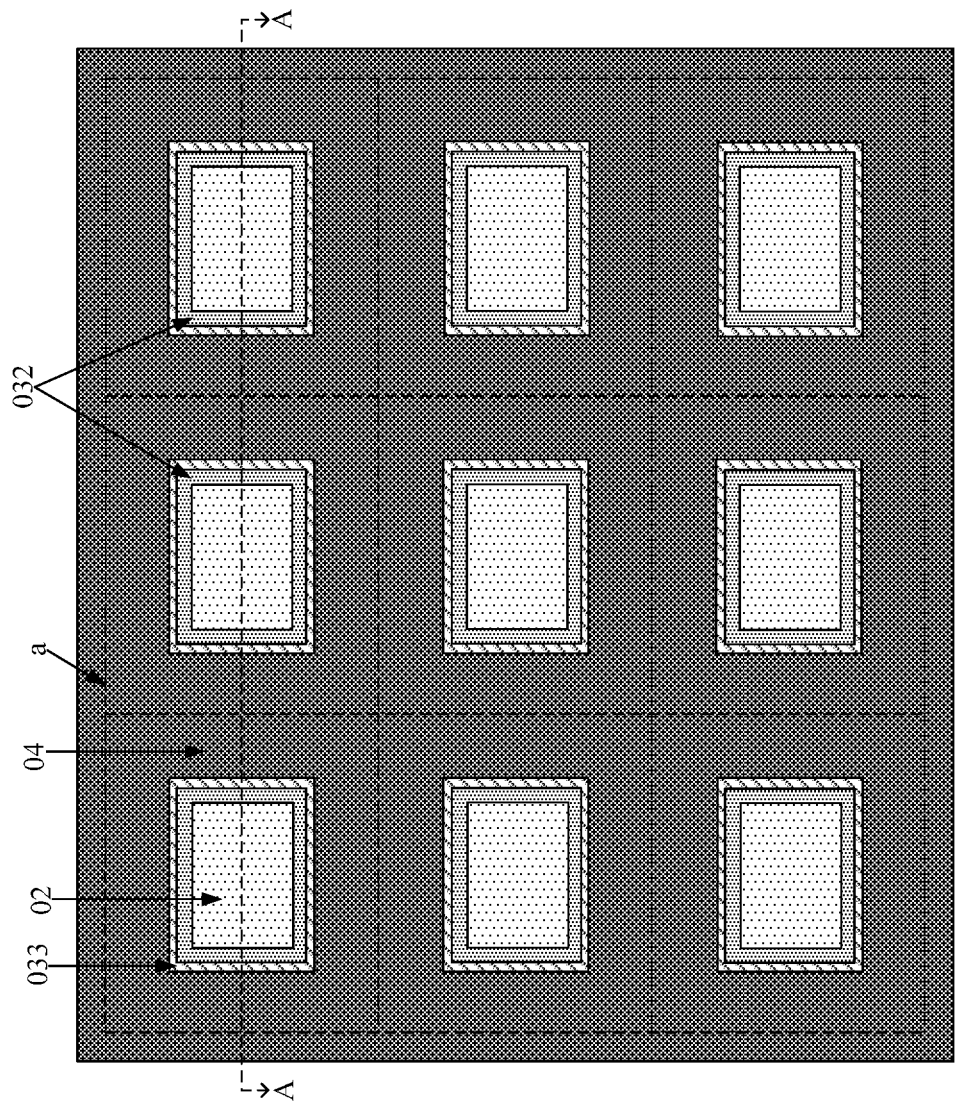
FIG. 20 is a top view after an isolation layer is formed on a panel motherboard according to an embodiment of the present disclosure.
Figure 21:
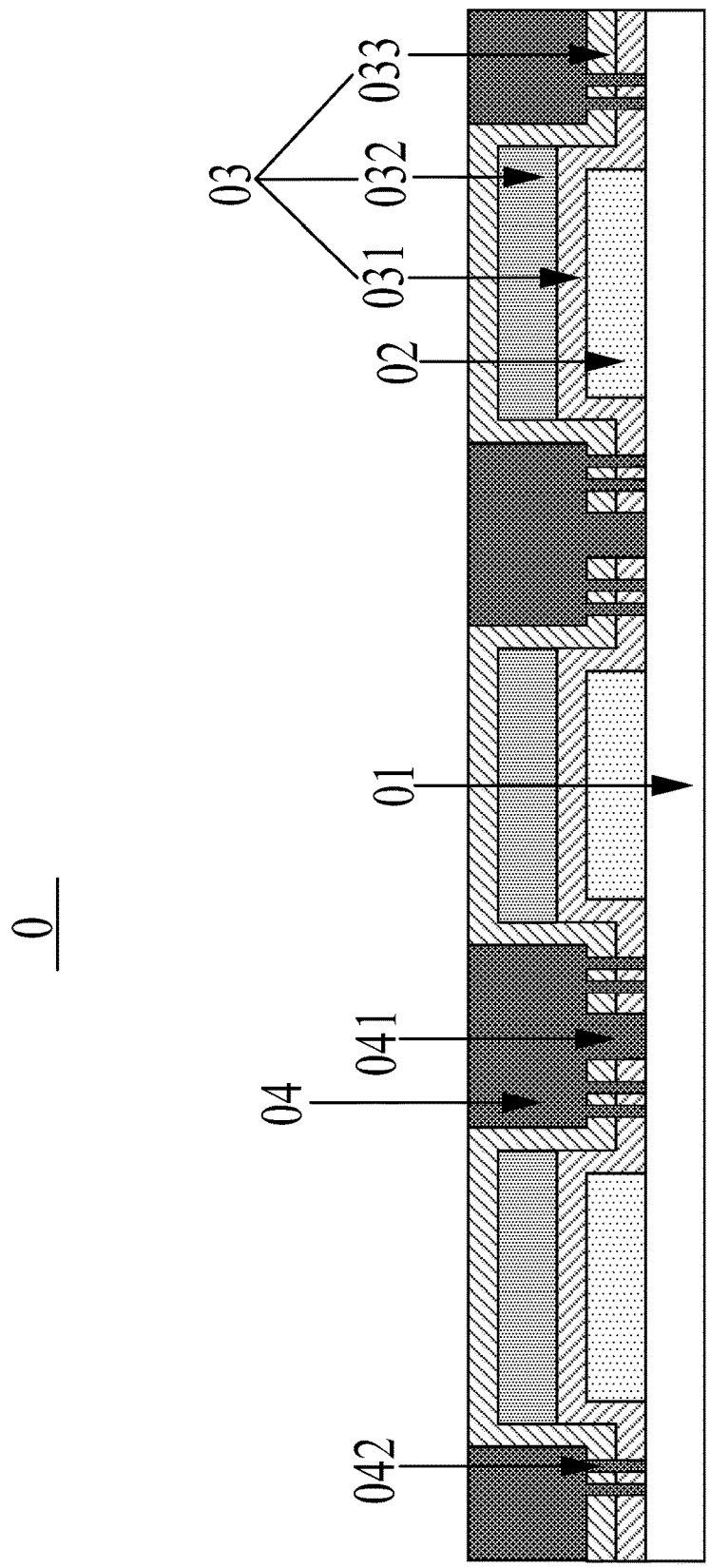
FIG. 21 is a sectional view after an isolation layer is formed on a panel motherboard according to an embodiment of the present disclosure.

FIG. 20 is a top view after forming an isolation layer 04 on the panel motherboard 0 according to an embodiment of the present disclosure, and FIG. 21 is a sectional view of the A-A portion of the panel motherboard shown in FIG. 20. Referring to FIGS. 20 and 21, the isolation layer 04 includes opening areas (not shown in FIGS. 20 and 21) and an isolation area (not shown in FIGS. 20 and 21). The opening areas correspond to the display areas of the panel motherboard 0, and the isolation area overlies the non-display area of the panel motherboard 0, and the cutting groove G is filled with the isolation material 041, and the protective seam H is filled with the isolation material 042. In FIGS. 20 and 21, the material forming the isolation layer 04 may be a PI material or an acrylic material, and the isolation layer 04 may be formed using an ink jet printing process.

Figure 22:
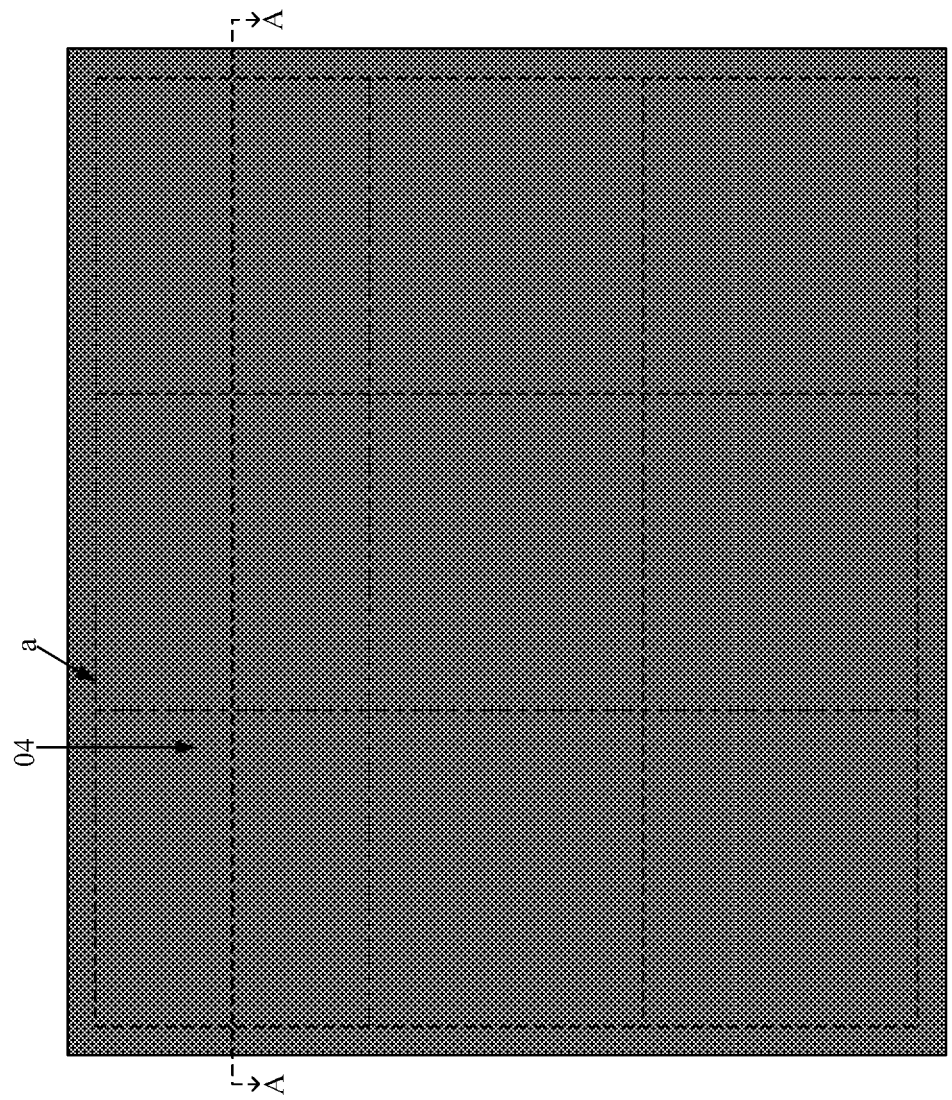
FIG. 22 is another top view after an isolation layer is formed on a panel motherboard according to an embodiment of the present disclosure.
Figure 23:
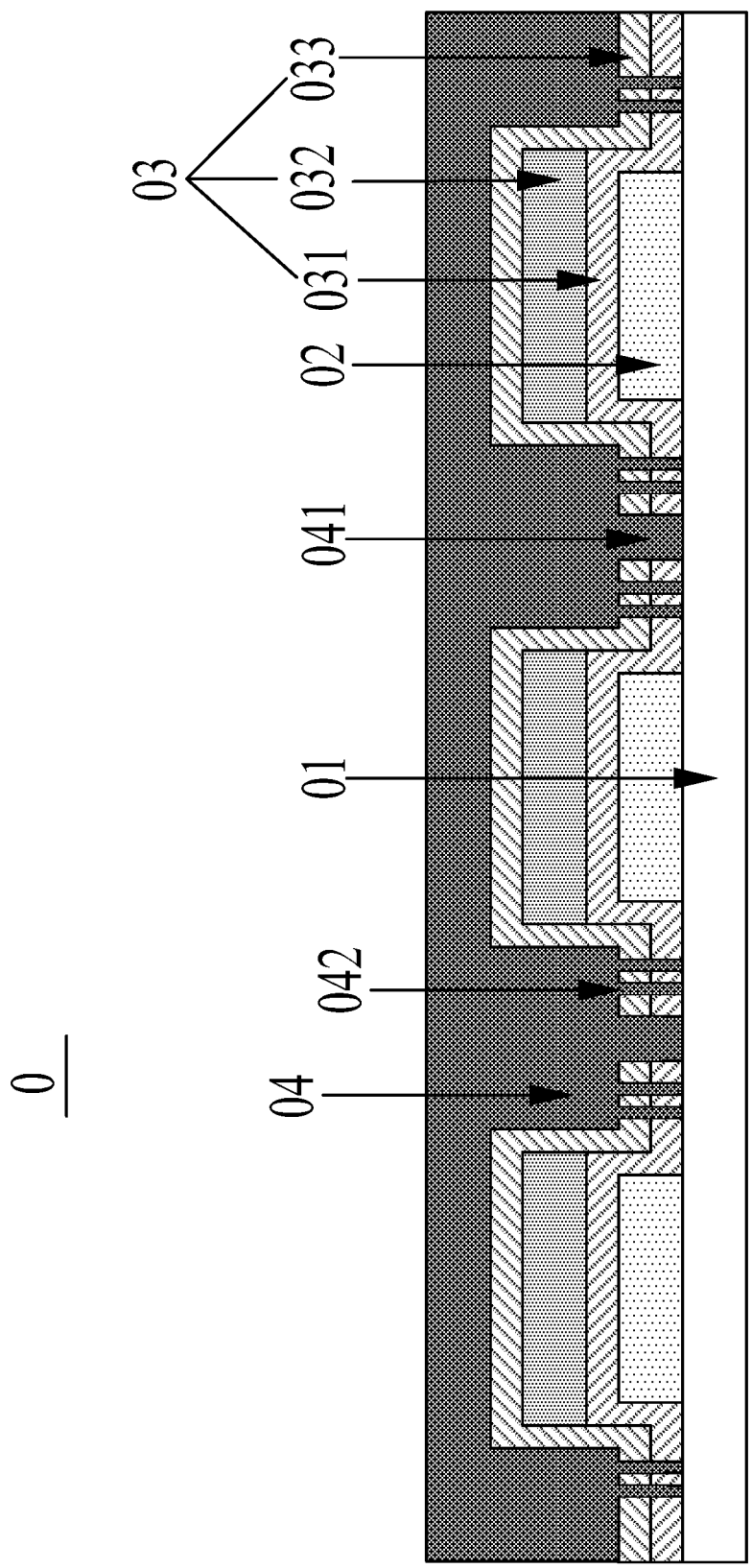
FIG. 23 is another sectional view after an isolation layer is formed on a panel motherboard according to an embodiment of the present disclosure.

FIG. 22 is another top view after forming the isolation layer 04 on the panel motherboard 0 according to an embodiment of the present disclosure, and FIG. 23 is a sectional view of the A-A portion of the panel motherboard shown in FIG. 22. Referring to FIGS. 22 and 23, the isolation layer 04 overlies the surface of the panel motherboard 0, the cutting groove G is filled with the isolation material 041, and the protective seam H is filled with the isolation material 042. In other words, the isolation layer 04 is integrally overlaid on the surface of the panel motherboard 0, that is, the display areas and the non-display area of the panel motherboard 0 are overlaid with the isolation layer 04. In FIGS. 22 and 23, the material forming the isolation layer 04 is an acrylic material.

In step 206, the panel motherboard is cut from the isolation material along the cutting line to obtain a display panel.

In the embodiment of the present disclosure, the panel motherboard may be cut from the isolation material along the cutting line of the display motherboard using a laser cutting process to obtain a display panel. The cutting tool commonly used in the laser cutting process is a laser. Optionally, the laser may be a carbon dioxide ($CO_2$) laser, a solid-state laser, an excimer laser, or the like.

Figure 24:
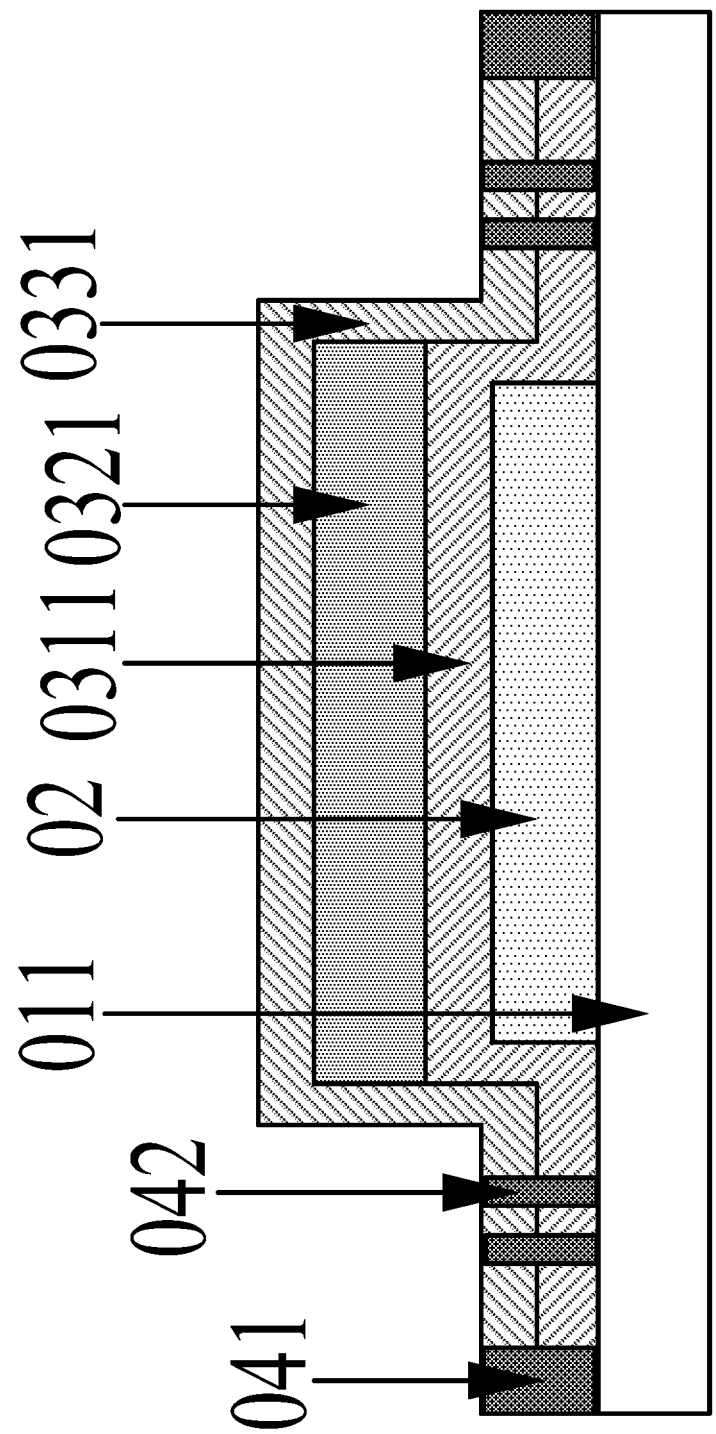
FIG. 24 is a structural diagram of a display panel according to an embodiment of the present disclosure.
Figure 25:
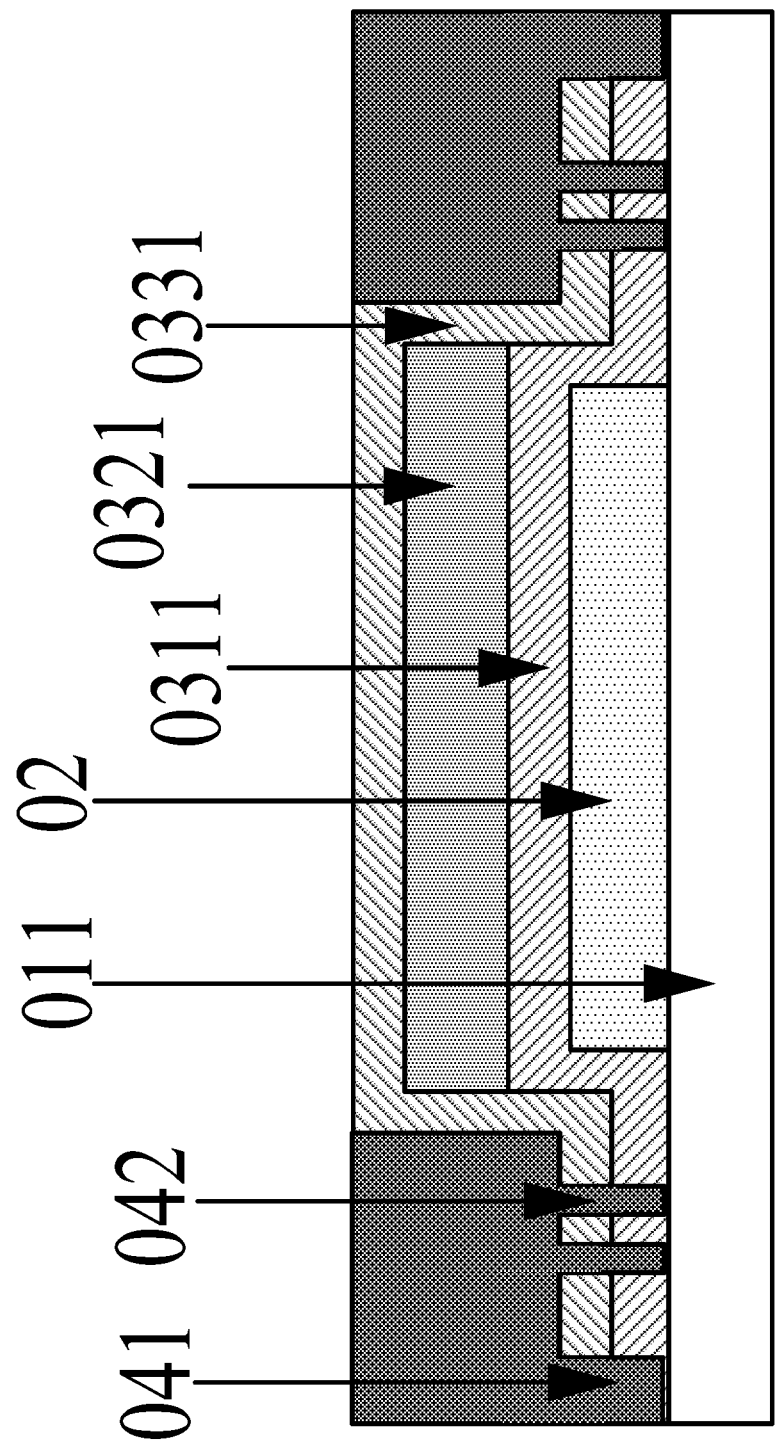
FIG. 25 is a structural diagram of another display panel according to an embodiment of the present disclosure.
Figure 26:
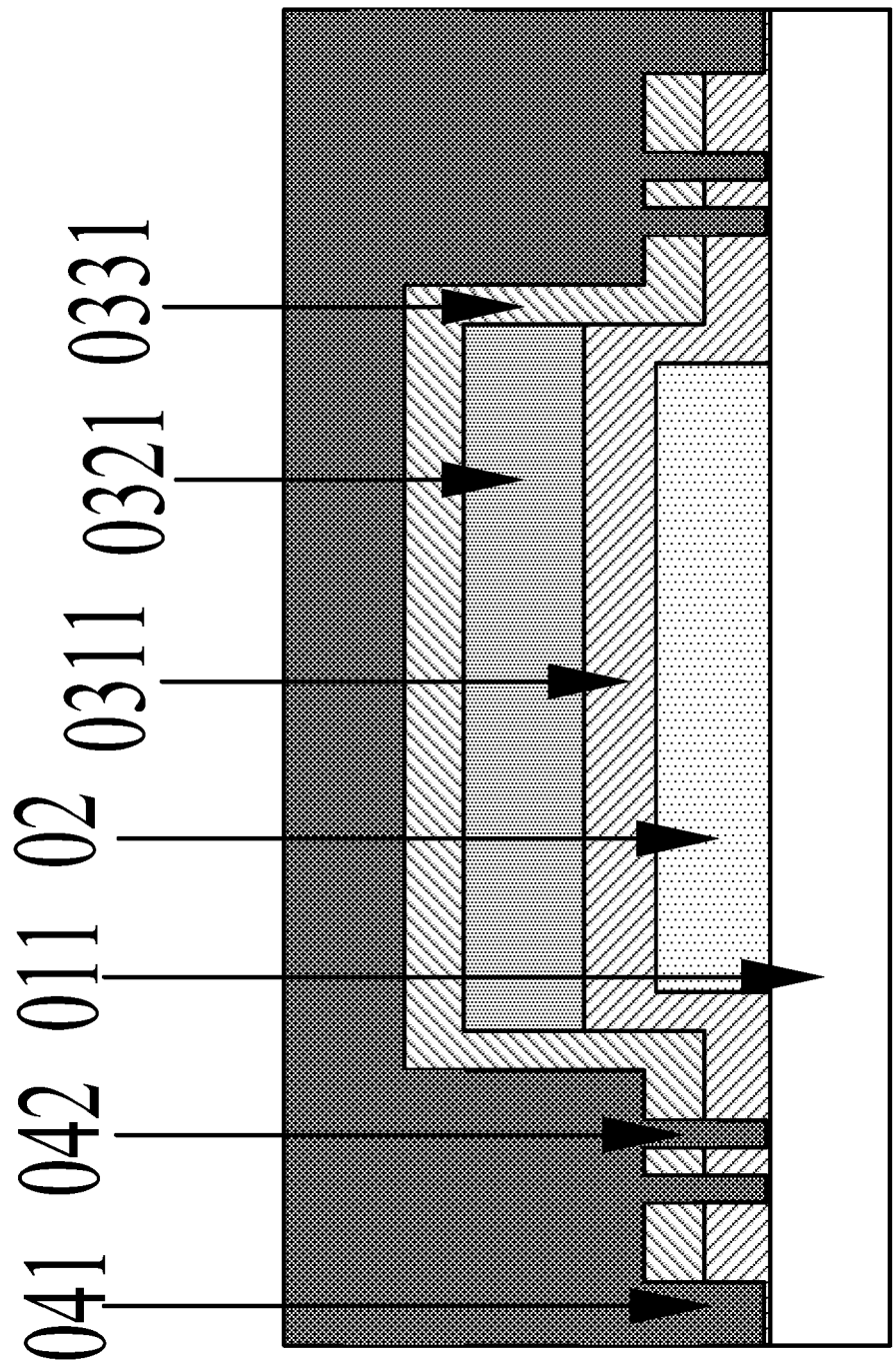
FIG. 26 is a structural diagram of yet another display panel according to an embodiment of the present disclosure.

FIG. 24 is a schematic structural view of the display panel obtained by cutting the panel motherboard 0 shown in FIG. 19, FIG. 25 is a schematic structural view of the display panel obtained by cutting the panel motherboard 0 shown in FIG. 21, and FIG. 26 is a schematic structural view of the display panel obtained by cutting the panel motherboard 0 shown in FIG. 23. Referring to any one of FIGS. 24 to 26, the display panel includes a display substrate 011, a display device 02 provided on the display substrate 011, and an encapsulation structure encapsulated on the outside of the display device 02 (not shown in FIGS. 24 to 26). The encapsulation structure is used to encapsulate the display device 02. As shown in any one of FIGS. 24 to 26, the encapsulation structure includes at least one encapsulation film layer, and the at least one encapsulation film layer may include an inorganic layer 0311, an organic layer 0321, and an inorganic layer 0331. The outsides of the inorganic layer 0311 and the inorganic layer 0331 are provided with an isolation material 041, and the periphery of the encapsulation structure is provided with a protective seam (not shown in FIGS. 24 to 26). The orthographic projection of the periphery of the encapsulation structure on the display panel is located in the non-display area of the display panel. The depth direction of the protective seam is perpendicular to the surface of the encapsulation structure, and the protective seam is filled with the insulation material 042. The display substrate 011 is a portion cut out from the display motherboard 01, the inorganic layer 0311 is a portion cut out from the inorganic layer 031, the organic layer 0321 is a portion cut out from the organic layer 032, and the inorganic layer 0331 is a portion cut out from the inorganic layer 033.

In the embodiment of the present disclosure, since the cutting groove is filled with the isolation material 041, the isolation material 041 can isolate a cutting tool from the inorganic layer to prevent the inorganic layer from cracking during the cutting process; and, in the display panel which is formed by cutting, as shown in any one of FIGS. 24 to 26, the isolation material 041 isolates the edge of the display panel from the outside world, so as to prevent the inorganic layer from cracking when the inorganic layer of the encapsulation structure is touched during handling of the display panel. Furthermore, even if the inorganic layer is cracked, the protective seam can block the crack and prevent the crack from propagating toward the display device 02. Also, the protective seam is filled with the isolation material 042, and the isolation material 042 can enhance the mechanical strength of the encapsulation structure.

In order to facilitate observation, in the embodiment of the present disclosure, the display device 02 is shown in FIG. 6, and the display device 02 and the organic layer 032 are shown in FIGS. 8, 10, 12, 14, 14, 16, 18, and 20. Since the inorganic layer 031 is overlaid on the display device 02 and the inorganic layer 033 is overlaid on the organic layer 032, the display device 02 cannot be observed in FIG. 6, and the display device 02 and the organic layer 032 cannot be observed in FIGS. 8, 10, 12, 14, 16, 18, and 20.

The order of the steps of the method for manufacturing a display panel according to the embodiment of the present disclosure may be adjusted appropriately, and the steps may also be added or deleted according to the situation. For example, the step 202 and step 203 above may be combined into one step; and the step 204 and step 205 above may be combined into one step; or, the order of the step 203 and step 204 above may be reversed. It will be apparent to those skilled in the art that various changes to the method may be made without departing from the technical scope of the present disclosure, and all of these changes should be considered as within the scope of protection of the present disclosure, which will not be repeated.

In summary, with respect to the method for manufacturing a display panel according to the embodiment of the present disclosure, a cutting groove is formed on the encapsulation structure layer along the cutting line of the panel motherboard, and the cutting groove is filled with an isolation material, and the panel motherboard is cut from the isolation material along the cutting line to obtain a display panel. Since the isolation material has greater flexibility than the encapsulation film layers in contact with the isolation material, the isolation material can isolate the encapsulation film layer to avoid cracks in the encapsulation film layer during cutting and handling, which helps to solve the problem of poor encapsulation effect of the encapsulation structure and improve the encapsulation effect of the encapsulation structure. Furthermore, since the encapsulation film layer overlies the surface of the display motherboard, there is no need for use of a mask in the process of forming the encapsulation film layer, and thus there is no need to reserve a margin area, which facilitates to achieve a narrow border display of the display panel, and reduces the manufacturing cost of the display panel.

An embodiment of the present disclosure further provides a display panel manufactured by the method shown in FIG. 1 or FIG. 2. The display panel may include an encapsulation structure comprising at least one encapsulation film layer. The outside of the at least one encapsulation film layer is provided with an isolation material, and the isolation material has greater flexibility than the encapsulation film layer in contact with the isolation material.

Optionally, the periphery of the encapsulation structure is provided with a protective seam, the depth direction of the protective seam is perpendicular to the surface of the encapsulation structure, and the orthographic projection of the periphery of the encapsulation structure on the display panel is located in a non-display area of the display panel.

Optionally, the protective seam is filled with the isolation material.

In an embodiment of the present disclosure, the display panel may be the one shown in any of FIG. 24 to FIG. 26.

Referring to any one of FIGS. 24 to 26, the at least one encapsulation film layer of the encapsulation structure includes an inorganic layer 0311, an organic layer 0321, and an inorganic layer 0331 which are sequentially superimposed. The outsides of the inorganic layer 0311 and the inorganic layer 0331 are both provided with an isolation material 041. The isolation material 041 may have greater flexibility than the inorganic layer 0311 and the inorganic layer 0331. The periphery of the encapsulation structure is provided with a protective seam (not shown in FIGS. 24 to 26), and the protective seam is filled with the isolation material 042.

Optionally, as shown in any one of FIGS. 24 to 26, the display panel further includes a display substrate 011, the display substrate 011 is provided with a display device 02, the encapsulation structure is used to encapsulate the display device 02. In the embodiment of the present disclosure, the display device 02 may be an OLED device or a QLED device. When the display device 02 is an OLED device, the display panel is an OLED display panel, for example, the display panel is an active matrix organic light-emitting diode (AMOLED) display panel. When the display device 02 is a QLED device, the display panel is a QLED display panel.

The structure of the display panel is described simply in the embodiment of the present disclosure. For the detailed structure of the display panel, reference may be made to the foregoing embodiment of the method for manufacturing a display panel, which will not be described here in the embodiment of the present disclosure.

An embodiment of the present disclosure further provides a display device. The display device may comprise a display panel, and the display panel may be the one shown in any of FIG. 24 to FIG. 26. The display device may be a mobile phone, a tablet, a TV, a display, a laptop computer, a digital picture frame, a navigator, or any other products or parts with display functionality.

Persons of ordinary skill in the art can understand that all or part of the steps described in the above embodiments can be completed through hardware, or through relevant hardware instructed by programs stored in a computer readable storage medium, such as read-only memory, magnetic disk or CD, etc.

The foregoing is only optional embodiments of the present disclosure, and is not intended to limit the present disclosure. Within the spirit and principles of the disclosure, any modifications, equivalent substitutions, improvements, etc., are within the scope of protection of the present disclosure.

What is claimed is:

1. A method for manufacturing a display panel, comprising steps of:
   forming an encapsulation structure layer on a display motherboard to obtain a panel motherboard, the encapsulation structure layer comprising at least one encapsulation film layer, and the at least one encapsulation film layer overlying a surface of the display motherboard;
   forming a cutting groove on the encapsulation structure layer along a cutting line of the panel motherboard;
   filling the cutting groove with an isolation material, the isolation material having greater flexibility than the encapsulation film layer in contact with the isolation material; and
   cutting the panel motherboard from the isolation material along the cutting line to obtain the display panel.

2. The method according to claim 1, wherein the method further comprises: after forming the encapsulation structure layer on the display motherboard to obtain the panel motherboard, forming a protective seam on the encapsulation structure layer, the protective seam being located between a display area and the cutting line of the panel motherboard, and the depth direction of the protective seam being perpendicular to a surface of the encapsulation structure layer.

3. The method according to claim 2, wherein the method further comprises: after forming the protective seam on the encapsulation structure layer, filling the protective seam with the isolation material.

4. The method according to claim 2, wherein said step of forming the cutting groove on the encapsulation structure layer along the cutting line of the panel motherboard comprises:
   forming the cutting groove on the encapsulation structure layer along the cutting line of the panel motherboard using an etching process;
   and
   said step of forming the protective seam on the encapsulation structure layer comprises:
   forming the protective seam on the encapsulation structure layer using an etching process.

5. The method according to claim 1, wherein said step of filling the cutting groove with the isolation material comprises: forming an isolation layer on the panel motherboard using the isolation material to fill the cutting groove with the isolation material.

6. The method according to claim 5, wherein the isolation material is one of a polyimide material and an acrylic material.

7. The method according to claim 6, wherein the panel motherboard has a non-display area and a display area,
   when the isolation material is one of a polyimide material and an acrylic material, the isolation layer comprises an isolation area that overlies the non-display area; and
   when the isolation material is an acrylic material, the isolation layer overlies the surface of the panel motherboard.

8. The method according to claim 1, wherein said step of cutting the panel motherboard from the isolation material along the cutting line comprises: cutting the panel motherboard from the isolation material along the cutting line using a laser cutting process.

9. The method according to claim 1, wherein the at least one encapsulation film layer comprises an inorganic layer, an organic layer, and an inorganic layer which are sequentially superimposed, and said step of forming the encapsulation structure layer on the display motherboard comprises:
   forming an inorganic layer on the display motherboard using a chemical vapor deposition process;
   forming an organic layer on the display motherboard on which the inorganic layer is formed using an ink jet printing process; and
   forming an inorganic layer on the display motherboard on which the organic layer is formed using a chemical vapor deposition process, thereby obtaining the encapsulation structure layer.

10. A display panel, comprising an encapsulation structure, wherein the encapsulation structure comprises at least one encapsulation film layer, the outside of the at least one encapsulation film layer is provided with an isolation material, and the isolation material has greater flexibility than the encapsulation film layer in contact with the isolation material.

11. The display panel according to claim 10, wherein the periphery of the encapsulation structure is provided with a protective seam, the depth direction of the protective seam is perpendicular to the surface of the encapsulation structure, and the orthographic projection of the periphery of the encapsulation structure on the display panel is located in a non-display area of the display panel.

12. The display panel according to claim 11, wherein the protective seam is filled with the isolation material.

13. The display panel according to claim 10, wherein the display panel further comprises a display substrate, the display substrate is provided with a display device, and the encapsulation structure is used to encapsulate the display device.

14. The display panel according to claim 13, wherein the display device is an organic light-emitting diode device or a quantum dot light-emitting diode device.

15. The display panel according to claim 10, wherein the at least one encapsulation film layer comprises an inorganic layer, an organic layer, and an inorganic layer which are sequentially superimposed.

16. A display device, comprising a display panel, wherein the display panel comprises an encapsulation structure, the encapsulation structure comprises at least one encapsulation film layer, the outside of the at least one encapsulation film layer is provided with an isolation material, and the isolation material has greater flexibility than the encapsulation film layer in contact with the isolation material.

17. The display device according to claim 16, wherein the periphery of the encapsulation structure is provided with a protective seam, the depth direction of the protective seam is perpendicular to the surface of the encapsulation structure, and the orthographic projection of the periphery of the encapsulation structure on the display panel is located in a non-display area of the display panel.

18. The display device according to claim 17, wherein the protective seam is filled with the isolation material.

19. The display device according to claim 16, wherein the display panel further comprises a display substrate, the display substrate is provided with a display device, and the encapsulation structure is used to encapsulate the display device.

20. The display device according to claim 19, wherein the display device is an organic light-emitting diode device or a quantum dot light-emitting diode device.

\* \* \* \* \*